US009595591B2

(12) United States Patent
Nagai

(10) Patent No.: US 9,595,591 B2
(45) Date of Patent: Mar. 14, 2017

(54) SEMICONDUCTOR DEVICE AND METHOD FOR MANUFACTURING SAME

(71) Applicant: PS5 Luxco S.a.r.l., Luxembourg (LU)

(72) Inventor: Takeshi Nagai, Tokyo (JP)

(73) Assignee: LONGITUDE SEMICONDUCTOR S.A.R.L., Luxembourg (LU)

( * ) Notice: Subject to any disclaimer, the term of this patent is extended or adjusted under 35 U.S.C. 154(b) by 0 days.

(21) Appl. No.: 14/646,461

(22) PCT Filed: Nov. 22, 2013

(86) PCT No.: PCT/JP2013/081477
§ 371 (c)(1),
(2) Date: May 21, 2015

(87) PCT Pub. No.: WO2014/081001
PCT Pub. Date: May 30, 2014

(65) Prior Publication Data
US 2015/0380504 A1     Dec. 31, 2015

(30) Foreign Application Priority Data

Nov. 26, 2012   (JP) ................................ 2012-257549

(51) Int. Cl.
*H01L 29/78*       (2006.01)
*H01L 29/423*      (2006.01)
(Continued)

(52) U.S. Cl.
CPC ........ *H01L 29/4238* (2013.01); *H01L 21/283* (2013.01); *H01L 21/823842* (2013.01);
(Continued)

(58) Field of Classification Search
CPC .................................................. H01L 29/4238
See application file for complete search history.

(56) References Cited

U.S. PATENT DOCUMENTS 8,524,570 B2 *   9/2013  Chuang ............. H01L 21/76224
                                                    257/330
8,735,987 B1 *   5/2014  Hoffmann ........... H01L 27/1116
                                                    257/369
(Continued)

OTHER PUBLICATIONS

Application No. PCT/JP2013/081477, International Search Report, Feb. 18, 2014.

*Primary Examiner* — Eugene Lee
(74) *Attorney, Agent, or Firm* — Kunzler Law Group, PC

(57) ABSTRACT

One device includes a substrate which contains a well region of one conductivity type, an element isolation insulating film which is arranged within the well region, an island-shaped active region which is surrounded by the element isolation insulating film, two first gate structures which are arranged on the island-shaped active region, and each of which is configured by sequentially laminating a lower gate insulating film, a gate insulating film having a high dielectric constant, a first gate electrode film containing a metal material, and a second gate electrode film, and a second gate structure which includes a second gate electrode film that is in contact with and covers a part of the element isolation insulating film. The two first gate structures and the second gate structure are successively arranged in the order of one first gate structure, the second gate structure and the other first gate structure.

11 Claims, 34 Drawing Sheets

(51) Int. Cl.
*H01L 21/8238* (2006.01)
*H01L 21/283* (2006.01)
*H01L 27/108* (2006.01)
*H01L 29/06* (2006.01)
*H01L 29/49* (2006.01)
*H01L 29/51* (2006.01)
*H01L 29/66* (2006.01)

(52) U.S. Cl.
CPC .... *H01L 21/823857* (2013.01); *H01L 27/108* (2013.01); *H01L 27/10844* (2013.01); *H01L 29/0692* (2013.01); *H01L 29/4958* (2013.01); *H01L 29/4966* (2013.01); *H01L 29/517* (2013.01); *H01L 29/66484* (2013.01); *H01L 29/7831* (2013.01); *H01L 29/6659* (2013.01); *H01L 29/7833* (2013.01)

(56) References Cited

U.S. PATENT DOCUMENTS

| | | | |
|---|---|---|---|
| 2011/0284966 A1* | 11/2011 | Wen | H01L 21/823456 257/368 |
| 2012/0119309 A1 | 5/2012 | Horita | |
| 2012/0119778 A1* | 5/2012 | Ahsan | H01L 22/34 324/762.09 |
| 2012/0235702 A1* | 9/2012 | Huang | G11C 16/0425 324/762.01 |
| 2013/0021840 A1 | 1/2013 | Tokita | |
| 2013/0026576 A1* | 1/2013 | Stockinger | H01L 27/0255 257/355 |
| 2013/0105908 A1* | 5/2013 | Saino | H01L 27/10891 257/369 |
| 2013/0264655 A1* | 10/2013 | Kishida | H01L 23/535 257/392 |

\* cited by examiner

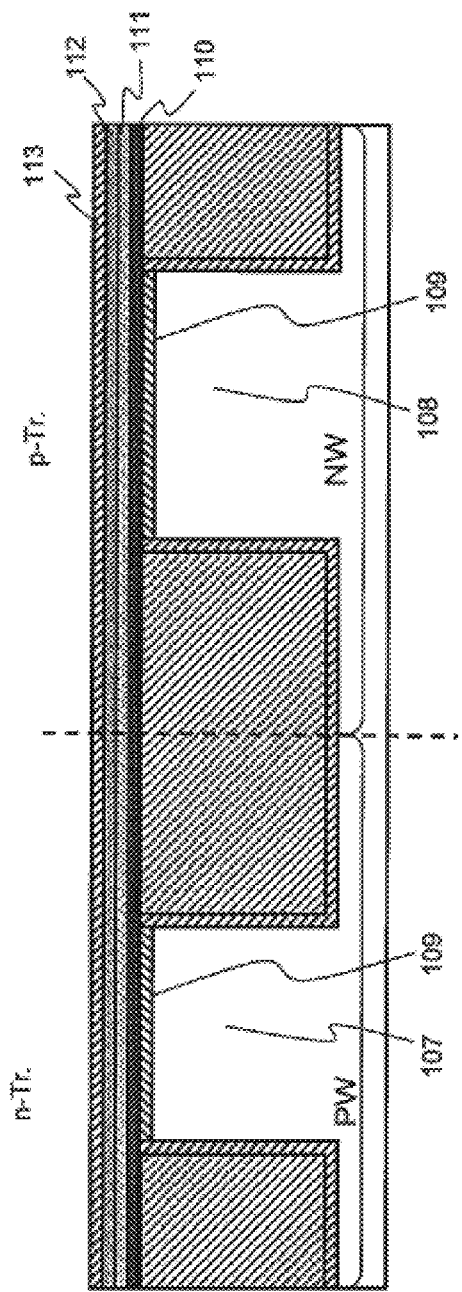

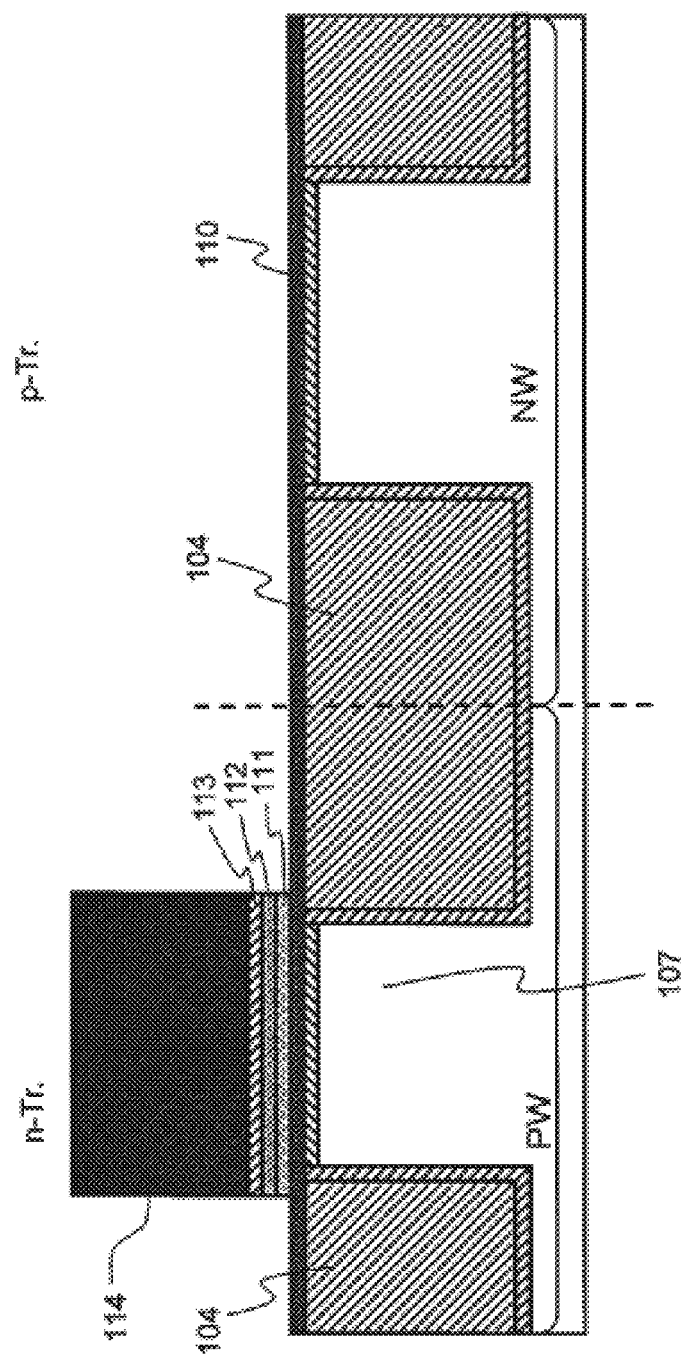

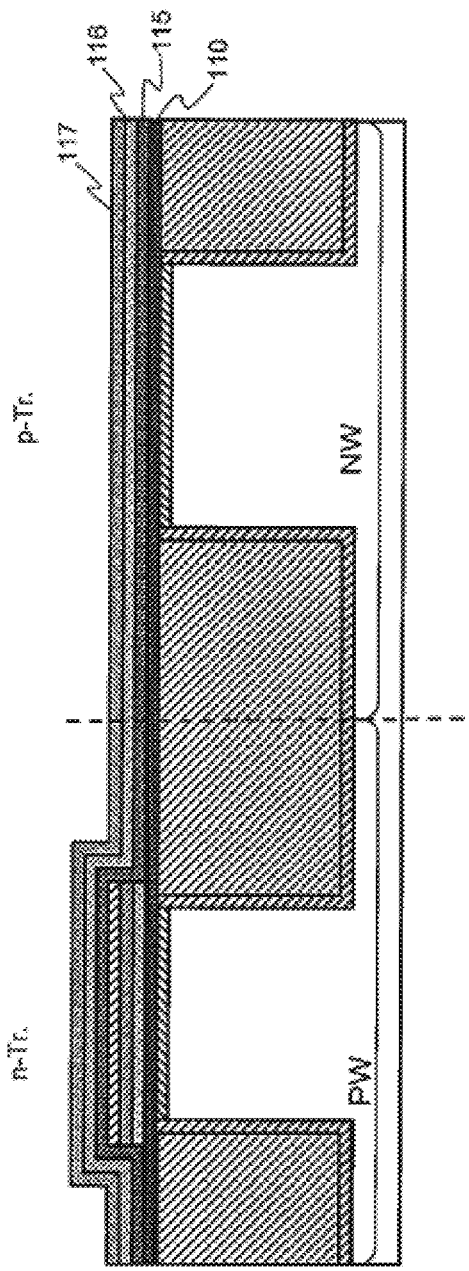

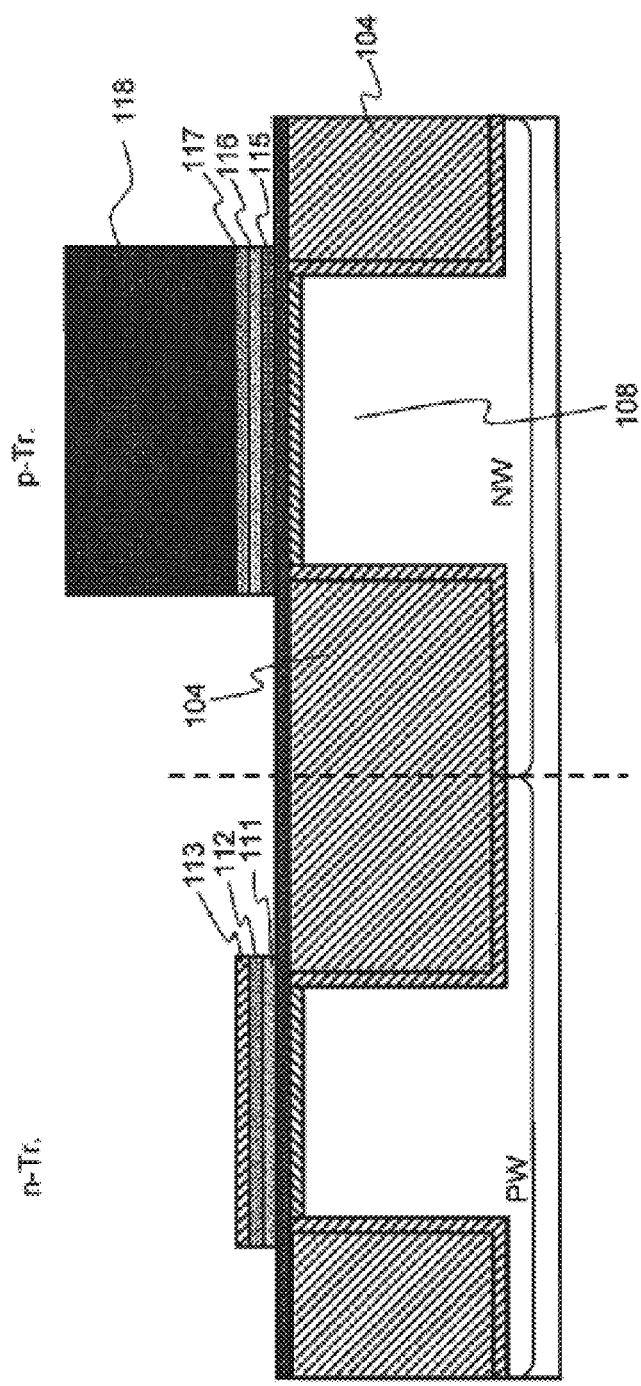

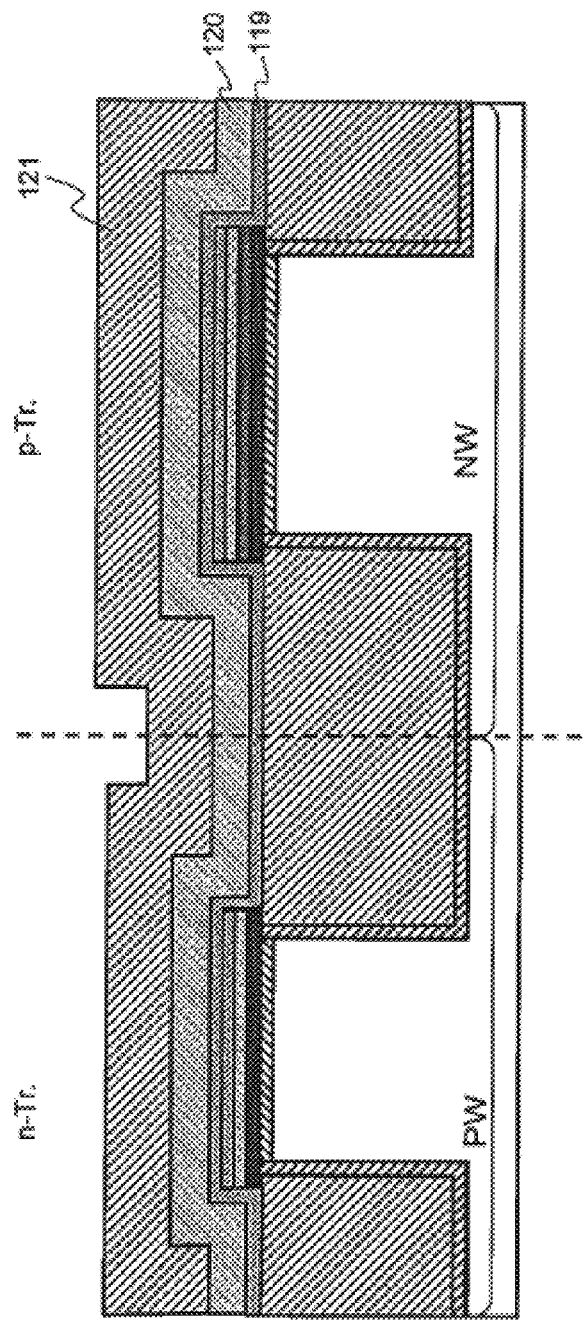

SEMICONDUCTOR DEVICE AND METHOD FOR MANUFACTURING SAME

TECHNICAL FIELD

The present invention relates to a semiconductor device and a method of manufacturing the same, and in particular relates to a semiconductor device containing transistors having an HKMG (high-k metal gate) construction, and a method of manufacturing the same.

BACKGROUND ART

The HKMG construction has been proposed in order to resolve various problem that arise in conjunction with developments involving reductions in the power supply voltage, increases in the speed, and increases in the degree of integration of transistors.

With transistors having an HKMG construction, it is known that the threshold shifts in accordance with the state of diffusion of oxygen in the high dielectric-constant (high-k) gate insulating film being employed (see patent literature articles 1 or 2, for example).

PATENT LITERATURE

Patent literature article 1: Japanese Patent Kokai 2009-283906
Patent literature article 2: Japanese Patent Kokai 2010-536169

SUMMARY OF THE INVENTION

Problems to be Resolved by the Invention

The oxygen which causes a shift in the threshold of a transistor having an HKMG construction may even be supplied from oxides in contact with the high dielectric-constant gate insulating film.

For example, during the manufacture of a semiconductor device, if annealing is performed while the high dielectric-constant gate insulating film is in contact with a silicon dioxide film filling an STI (shallow trench isolation) defining an active region, oxygen is supplied from the silicon dioxide film to the high dielectric-constant gate insulating film. If the oxygen supplied to the high dielectric-constant gate insulating film spreads as far as a section above the channel of the transistor, the threshold of the transistor shifts.

The amount by which the threshold of the transistor shifts in response to the oxygen supplied from the surroundings depends on the channel width W of the transistor, and also depends to a great extent on the surface area of the channel and the surface area of the high dielectric-constant gate insulating film on the silicon dioxide film of the STI.

Normally, the plurality of transistors which form a semiconductor device are formed in a mixture of various layouts. The amount of shift in the transistor may therefore differ depending on the layout. As a result, there is a problem in that it is difficult to control the threshold voltages of the plurality of transistors contained in a related semiconductor device.

Means of Overcoming the Problems

A device according to one mode of embodiment of the present invention comprises: a substrate containing a well region of one conduction type; an element isolation insulating film disposed in the well region; an island-shaped active region the periphery of which is surrounded by the element isolation insulating film; two first gate structures disposed on the island-shaped active region, each first gate structure being formed by successively laminating a lower-layer gate insulating film, a gate insulating film having a high dielectric constant, a first gate electrode film containing a metal material, and a second gate electrode film; and a second gate structure comprising the second gate electrode film which is in contact with and covers a portion of the element isolation insulating film; wherein the two first gate structures and the second gate structure are disposed contiguously in the following order, namely one of the first gate structures, the second gate structure, the other first gate structure.

A device according to another mode of embodiment of the present invention includes a semiconductor substrate comprising, on one surface side thereof, an island-shaped first active region surrounded by an element isolation insulating film formed in an embedded manner, and a gate structure formed on one surface of the semiconductor substrate; wherein the gate structure includes a first part which extends in a first direction in such a way as to cross over the first active region, and a second part which extends in a second direction intersecting the first direction, and which is disposed on the element isolation insulating film in such a way as to connect to the first part; at least a part of the first part that is located on the first active region employs a first structure in which a high dielectric-constant film, a first electrode film containing a metal, and a second electrode film different from the first electrode film are successively laminated; and the second part employs a second structure which includes the second electrode film but does not include the high dielectric-constant film or the first electrode film.

In a method of manufacturing a device according to yet another mode of embodiment of the present invention, a high dielectric-constant film and a first electrode film containing a metal are formed by lamination on one surface side of a semiconductor substrate in such a way as to cover an active region surrounded by an element isolation insulating film; a second electrode film is formed in such a way as to cover the high dielectric-constant film and the first electrode film, and in such a way as to cover the element isolation insulating film; and the second electrode film, the first electrode film and the high dielectric-constant film are patterned to form a gate structure which includes a plurality of first parts crossing the active region in a first direction, and a second part which extends in a second direction intersecting the first direction and which connects the plurality of first parts to one another, and wherein, in the second part, the second electrode film is in contact with the element isolation insulating film.

Advantages of the Invention

According to the present invention, a gate insulating film having a high dielectric constant is employed in two first gate structures disposed on an island-shaped active region, and a second gate electrode film which is in contact with and covers a portion of an element isolation insulating film is employed in a second gate structure disposed contiguously between said first gate structures. It is thus possible to reduce the surface area of contact between the high dielectric-constant gate insulating film and the element isolation insulating film, which could be an oxygen supply source. As a result, the amount of shift in the threshold of the transistor formed in the active region can be reduced, and the threshold can be accurately controlled.

BRIEF EXPLANATION OF THE DRAWINGS

FIG. 5C is a drawing used to describe the step following the step illustrated in FIGS. 4A, 4B and 4C, being a cross-sectional view in a position corresponding to the line C-C' in FIG. 1.

FIG. 6C is a drawing used to describe the step following the step illustrated in FIGS. 5A, 5B and 5C, being a cross-sectional view in a position corresponding to the line C-C' in FIG. 1.

FIG. 7C is a drawing used to describe the step following the step illustrated in FIGS. 6A, 6B and 6C, being a cross-sectional view in a position corresponding to the line C-C' in FIG. 1.

FIG. 8C is a drawing used to describe the step following the step illustrated in FIGS. 7A, 7B and 7C, being a cross-sectional view in a position corresponding to the line C-C' in FIG. 1.

FIG. 10C is a drawing used to describe the step following the step illustrated in FIGS. 9A, 9B and 9C, being a cross-sectional view in a position corresponding to the line C-C' in FIG. 1.

MODES OF EMBODYING THE INVENTION

Modes of embodying the present invention will now be described in detail with reference to the drawings.

Figure 1:
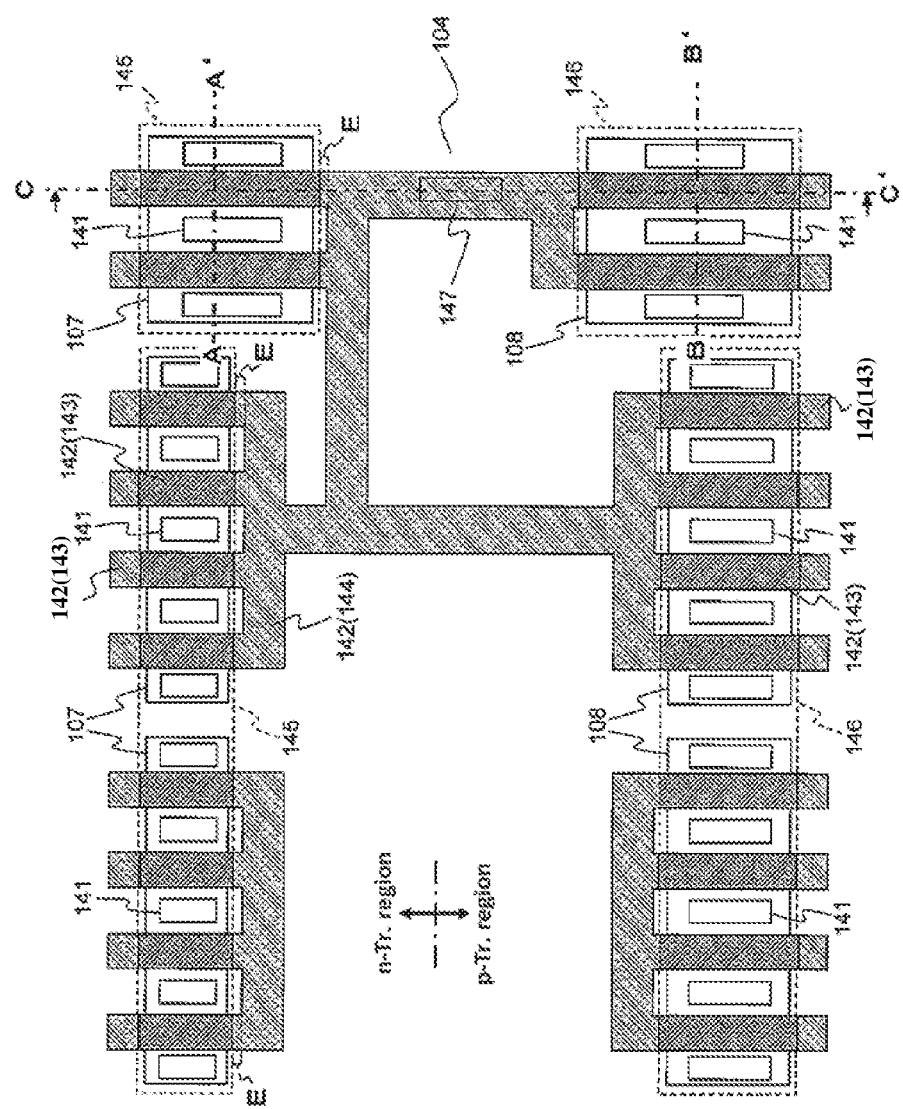
FIG. 1 is a drawing illustrating the planar layout of a semiconductor device according to a first mode of embodiment of the present invention.

FIG. 1 is a drawing illustrating the planar layout of part of a semiconductor device according to a first mode of embodiment of the present invention. Here, a DRAM (Dynamic Random Access Memory) is taken to be the semiconductor device, and FIG. 1 illustrates part of a peripheral circuit thereof. However, the present invention is not limited to DRAMs, and can also be applied to various other semiconductor devices.

The upper side of FIG. 1 is an n-channel transistor (n-Tr) region, and the lower side is a p-channel transistor (p-Tr) region. A plurality of active regions 107 and 108 are defined in each of the transistor regions. The periphery of each of the active regions 107 and 108 is surrounded by an element isolation insulating film 104, thereby defining an island shape. Any one of the two or more active regions 107 or 108 formed in each transistor region is sometimes referred to as a first island-shaped active region, and another is sometimes referred to as a second island-shaped active region. The element isolation insulating film 104 comprises $SiO_2$, for example, and is formed embedded in a trench (STI) (102 in FIGS. 2A to 2C) formed on one surface side of a semiconductor substrate (101 in FIGS. 2A to 2C).

A transistor is formed in each of the active regions 107 and 108. Source/drain contacts 141 are disposed corresponding to S/D (source/drain) regions (125 in FIGS. 2A and 2B) of each transistor. As can be understood from the number, size and disposition of the source/drain contacts 141, the layout of the transistors differs depending on the conduction type, the application and the like.

Further, gate structures 142 are formed as illustrated by the two types of hatching. The gate structures 142 include first structural parts 143 indicated by one type of hatching, and second structural parts 144 indicated by the other type of hatching. The structure of the first structural parts 143 (first structures or first gate structures) and the structure of the second structural parts 144 (second structures or second gate structures) have configurations that differ from one another in the film thickness direction, as discussed hereinafter. It should be noted that the first structural parts 143 in the n-channel transistor region and the first structural parts 143 in the p-channel transistor region are structures that are similar but not exactly identical.

In the gate structures 142, parts extending in a first direction (the vertical direction in the drawing) in such a way as to cross the active regions 107 and 108, passing between adjacent source/drain contacts 141, are sometimes referred to as first parts. Further, with relation to each first part, one or more other first parts electrically connected to said first part are sometimes referred to as third parts. The first parts (gate portions) mainly employ the first structure. The length of the first structural parts 143 in the vertical direction in the drawing coincides with first and second gate stack PR resist mask forming regions 145 and 146 indicated by the dashed lines.

Further, in the gate structures 142, parts extending in a second direction (the left-right direction in the drawing) intersecting the first direction, and connected to the first parts, are sometimes referred to as second parts. The second parts connect the first parts and the third parts of the gate structures 142. In FIG. 1, the second parts connect the first parts and the third parts of gate structures 142 formed in the same active region, but there are also cases in which the second parts connect the first parts and the third parts of gate structures 142 formed in different active regions.

Gate wiring lines, including the second parts of the gate structures, employ the second structure. Gate contacts 147 are connected to the gate wiring lines.

The structure of the semiconductor device in FIG. 1 will now be described in detail with reference to FIGS. 2A, 2B and 2C.

Figure 2A:
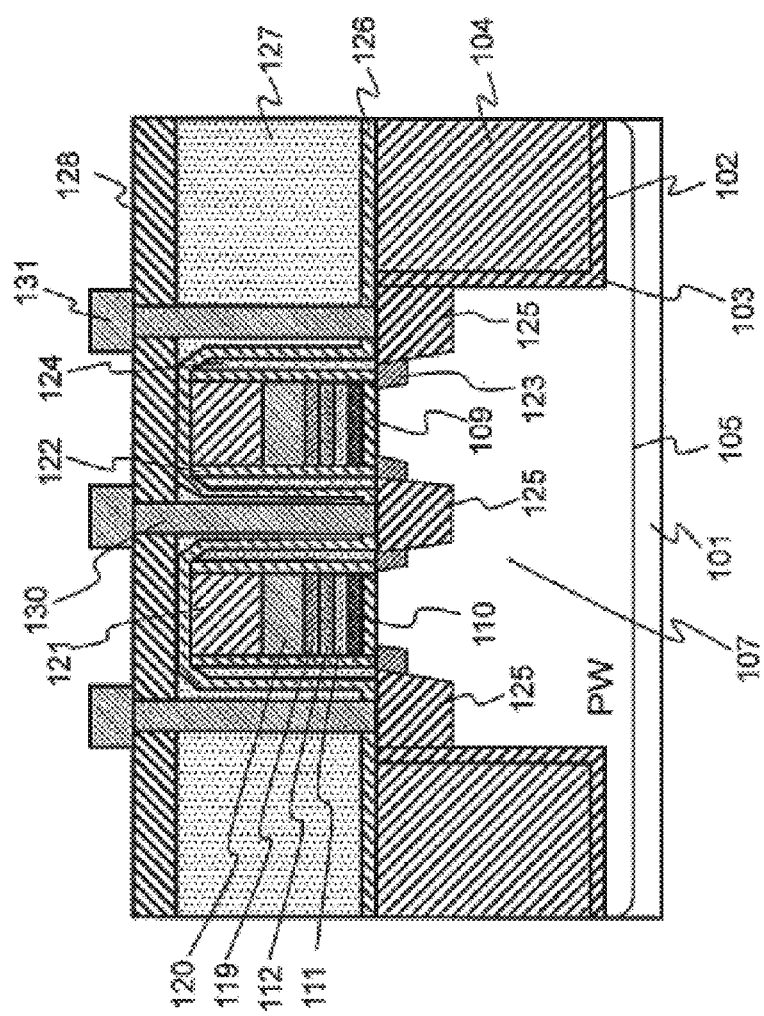
FIG. 2A is a cross-sectional view along the line A-A' in FIG. 1.
Figure 2B:
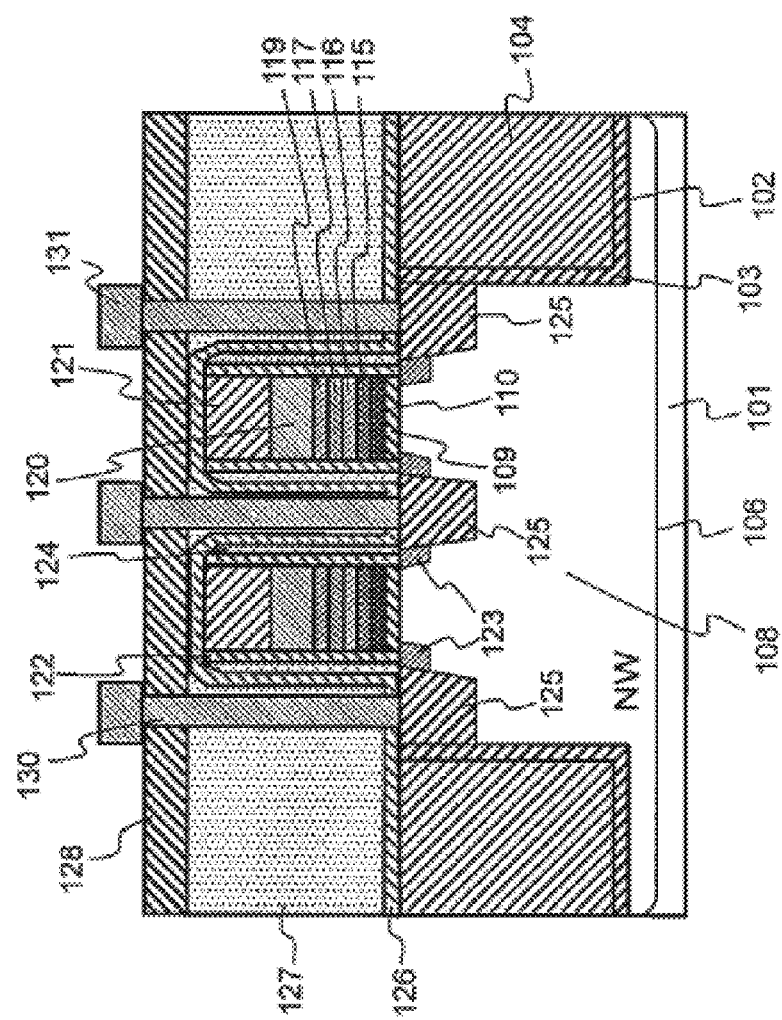
FIG. 2B is a cross-sectional view along the line B-B' in FIG. 1.
Figure 2C:
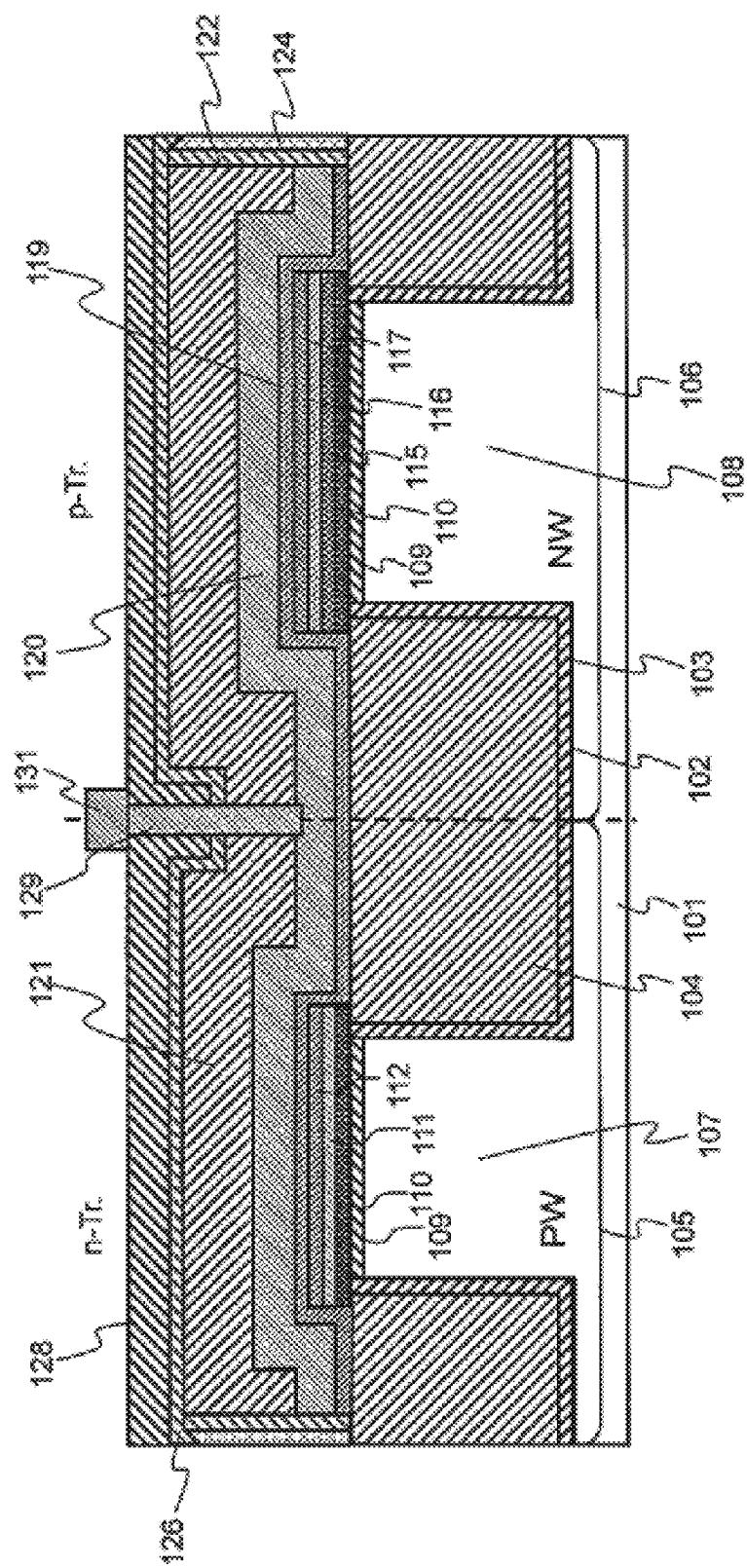
FIG. 2C is a cross-sectional view along the line C-C in FIG. 1.

FIGS. 2A, 2B and 2C are respectively a cross-sectional view along the line A-N, a cross-sectional view along the line B-B' and a cross-sectional view along the line C-C' in FIG. 1. However, these drawings illustrate the state midway through the manufacture of the semiconductor device. Further, the source/drain contacts 141 and the gate contacts 147 are omitted from these drawings. In addition, in the drawings, the size and the horizontal-to-vertical ratio of each part differ from those in an actual semiconductor device. Further, in FIG. 2C the central portion has been collapsed, and is not illustrated.

Referring to FIGS. 2A, 2B and 2C, a p-type well (PW) 105 is formed in an n-channel transistor forming region on one surface side of the semiconductor substrate 101, and an n-type well (NW) 106 is formed in a p-channel transistor forming region.

Further, trenches 102 are formed in the semiconductor substrate 101. A pad silicon dioxide film 103 is formed on the inner surfaces of the trenches 102. The trenches 102 are then filled using the element isolation insulating film 104. The active regions 107 and 108 are defined by being surrounded at their periphery by the element isolation insulating film 104.

LDD (Lightly Doped Drain) regions 123 and S/D regions 125 are formed by ion implantation in the active regions 107 and 108.

Referring to FIG. 2A, a lower-layer gate insulating film 109, a first high dielectric-constant film 110, a metal gate electrode film 111, a non-doped amorphous silicon gate electrode film 112, a phosphorus-doped amorphous silicon gate electrode film 119, a metal laminated film 120 and a silicon nitride film 121 are formed in a laminated manner on the active region 107. This laminated structure is the first structure employed in the first structural parts 143 of the gate structures 142 in the n-channel transistor region.

Meanwhile, referring to FIG. 2B, the lower-layer gate insulating film 109, the first high dielectric-constant film 110, a second high dielectric-constant film 115, a metal gate electrode film 116, an amorphous silicon gate electrode film 117, the phosphorus-doped amorphous silicon gate electrode film 119, the metal laminated film 120 and the silicon nitride film 121 are formed in a laminated manner on the active region 108. This laminated structure is the first structure employed in the first structural parts 143 of the gate structures 142 in the p-channel transistor region.

Although the details of the first structure in the n-channel transistor region and the first structure in the p-channel transistor region differ, they have a commonality in that they are provided with the lower-layer gate insulating film (109), the gate insulating films having a high dielectric constant (110 and 115), and the first gate electrode film (111) and second gate electrode films (119 and 120) which contain a metal material.

Next, referring to FIG. 2C, the phosphorus-doped amorphous silicon gate electrode film 119 is formed on the element isolation insulating film 104, in contact with said element isolation insulating film and covering part thereof, and the metal laminated film 120 and the silicon nitride film 121 are formed thereon. This laminated structure is the second structure employed in the second structural parts 144 of the gate structures 142. It should be noted that the phosphorus-doped amorphous silicon gate electrode film 119, the metal laminated film 120 and the silicon nitride film 121 are common to the first structural parts 143 and the second structural parts 144.

As illustrated in FIG. 2A and FIG. 2B, offset spacers 122 and side wall spacers 124 are formed on the side surfaces of the gate structures 142 having the laminated structure discussed hereinabove.

Referring again to FIGS. 2A to 2C, a liner silicon nitride film 126 is formed in such a way as to cover the gate structures 142 on the side surfaces of which the spacers 122 and 124 have been formed. Further, an interlayer insulating film 127 is formed in such a way as to embed the gate structures 142 covered by the liner silicon nitride film 126. Further, a cap silicon dioxide film 128 is formed on the interlayer insulating film 127.

A connecting plug 129 connected to the metal laminated film 120 and connecting plugs 130 connected to the S/D regions 125 are formed, and wiring lines 131 connected to the connecting plugs 129 and 130 are also formed.

In the semiconductor device configured as discussed hereinabove, the first high dielectric-constant film 110 (or the first structural part 143) is formed in such a way that the surface area thereof overlapping the element isolation insulating film 104 is as small as possible. In other words, the first high dielectric-constant film 110 (or the first structural part 143) is formed in such a way that its length in the first direction (the left-right direction in FIG. 2C) is as short as possible.

More specifically, as can be understood from FIG. 1, the length of the first high dielectric-constant film 110 (or the first structural part 143) in the first direction is shorter than the length of the first part of the gate structure 142 in the first direction. This signifies that the entire first part of the gate structure 142 does not employ the first structure, and that the second structure (also called a third structure or third gate structure) is employed in a part E of the first part, at the boundary between the first part and the second part. Then the gate wiring lines (the parts excluding the gate portions), including the second parts of the gate structures 142, employ the second structure.

According to the abovementioned configuration, in this mode of embodiment the surface area of the first high dielectric-constant film 110 in contact with the element isolation insulating film 104 is reduced. As a result it is possible substantially to eliminate the spread of oxygen from the element isolation insulating film 104 to the first high dielectric-constant film 110 when an annealing process is performed. Thus there is substantially no variation in the thresholds of the transistors, and the thresholds can therefore be accurately controlled.

A method of manufacturing the semiconductor device according to this mode of embodiment will next be described with reference to FIG. 3A to FIG. 12C. Here, drawings having a drawing number with the letter A appended are cross-sectional views in a location corresponding to the line A-A' in FIG. 1, drawings with the letter B appended are cross-sectional views in a location corresponding to the line B-B', and drawings with the letter C appended are cross-sectional views in a location corresponding to the line C-C'.

Figure 3A:
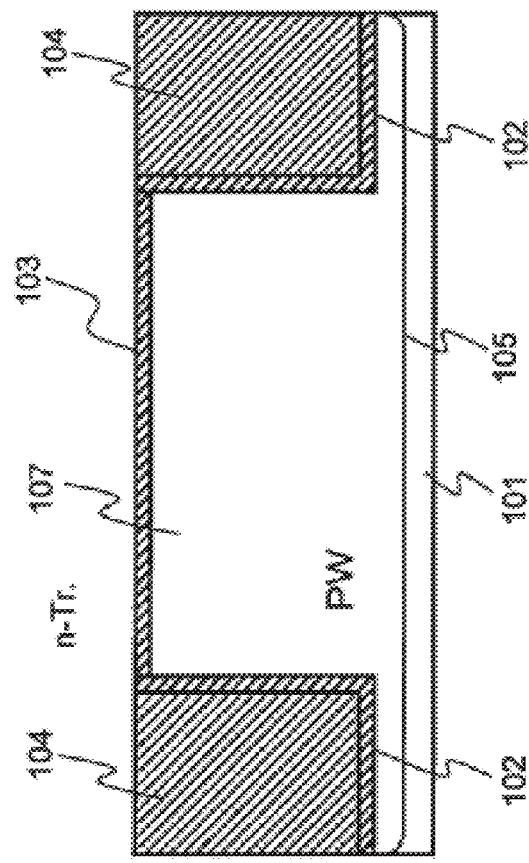
FIG. 3A is a drawing used to describe a method of manufacturing the semiconductor device according to the first mode of embodiment of the present invention, being a cross-sectional view in a position corresponding to the line A-A' in FIG. 1.
Figure 3B:
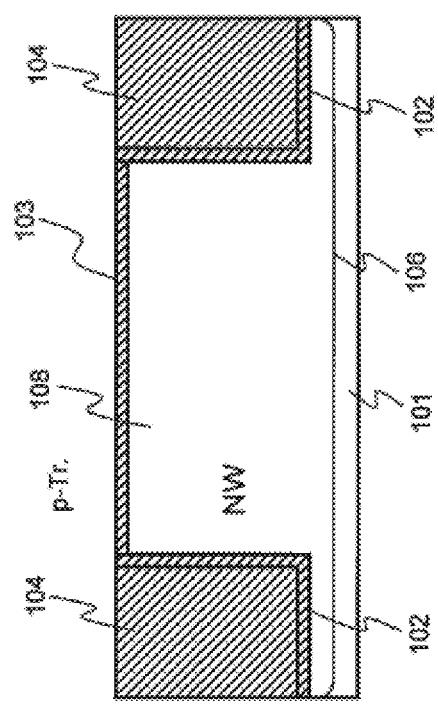
FIG. 3B is a drawing used to describe the method of manufacturing the semiconductor device according to the first mode of embodiment of the present invention, being a cross-sectional view in a position corresponding to the line B-B' in FIG. 1.
Figure 3C:
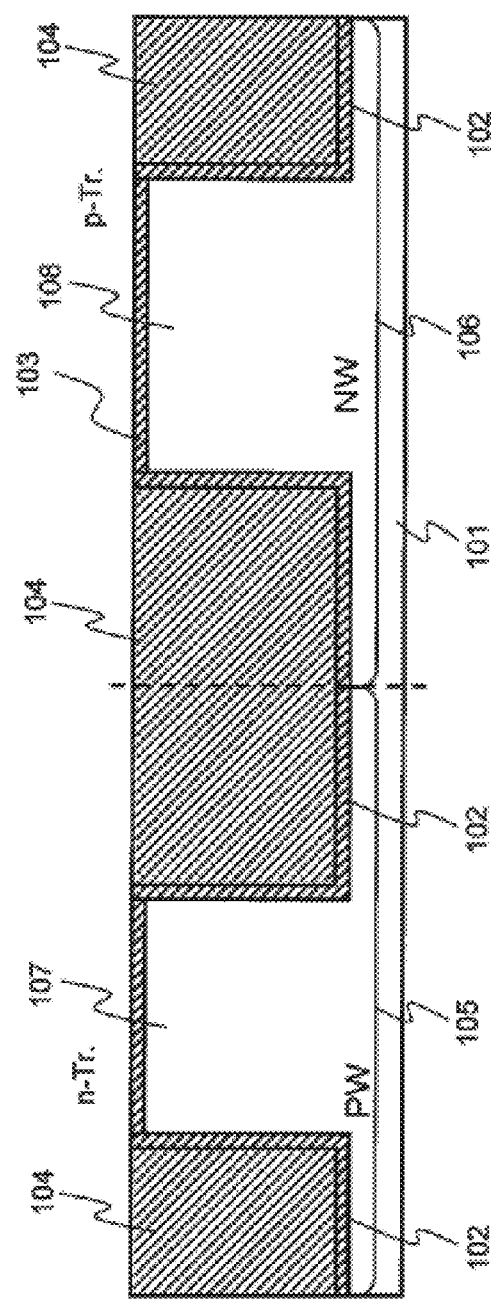
FIG. 3C is a drawing used to describe the method of manufacturing the semiconductor device according to the first mode of embodiment of the present invention, being a cross-sectional view in a position corresponding to the line C-C in FIG. 1.

First, as illustrated in FIGS. 3A, 3B and 3C, STI trenches (grooves) 102 are formed in one surface of a semiconductor substrate (silicon substrate) 101. A pad silicon dioxide film 103 is then formed on the surface of the semiconductor substrate 101 and the inner surfaces of the trenches 102. The interiors of the trenches 102 are then filled using an element isolation insulating film (silicon dioxide film) 104 to form element isolation regions. Mutually different impurities are introduced into prescribed regions of the semiconductor substrate 101 by ion implantation, to form p-type and n-type wells (PW, NW) 105 and 106, to form channel-stoppers, and to effect channel doping, which controls the threshold Vth. Active regions 107 and 108 surrounded at their periphery by the element isolation insulating film 104 are thus defined on one surface side of the semiconductor substrate 101.

Figure 4A:
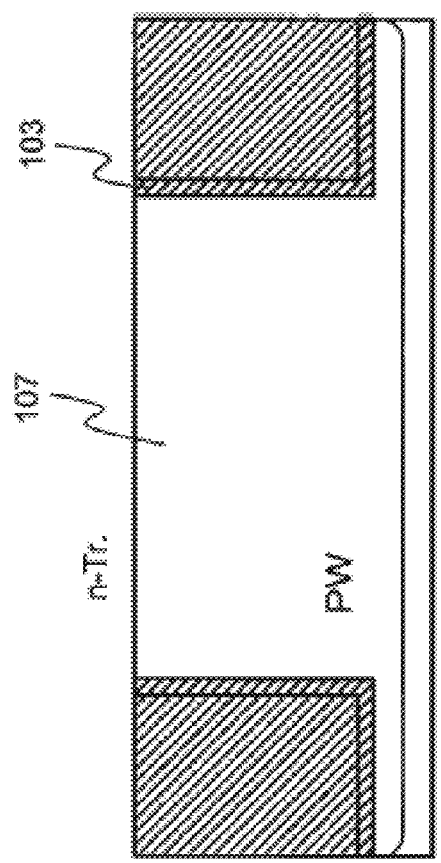
FIG. 4A is a drawing used to describe the step following the step illustrated in FIGS. 3A, 3B and 3C, being a cross-sectional view in a position corresponding to the line A-A' in FIG. 1.
Figure 4B:
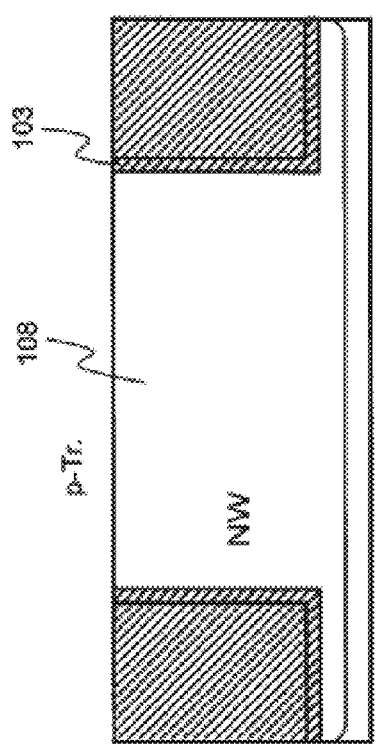
FIG. 4B is a drawing used to describe the step following the step illustrated in FIGS. 3A, 3B and 3C, being a cross-sectional view in a position corresponding to the line B-B' in FIG. 1.
Figure 4C:
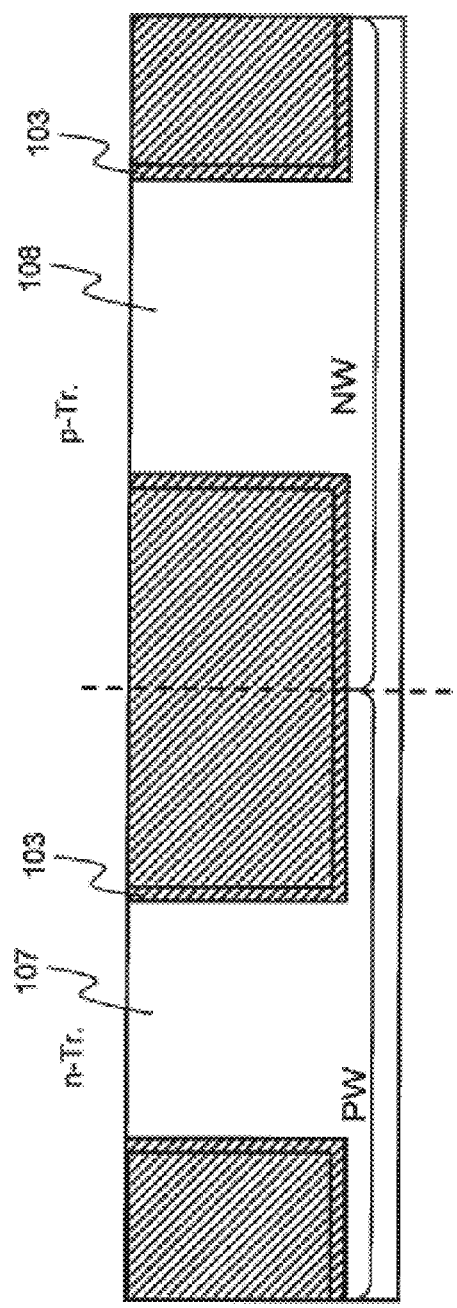
FIG. 4C is a drawing used to describe the step following the step illustrated in FIGS. 3A, 3B and 3C, being a cross-sectional view in a position corresponding to the line C-C' in FIG. 1.

The pad silicon dioxide film 103 on the active regions 107 and 108 is then removed, as illustrated in FIGS. 4A, 4B and 4C.

Figure 5A:
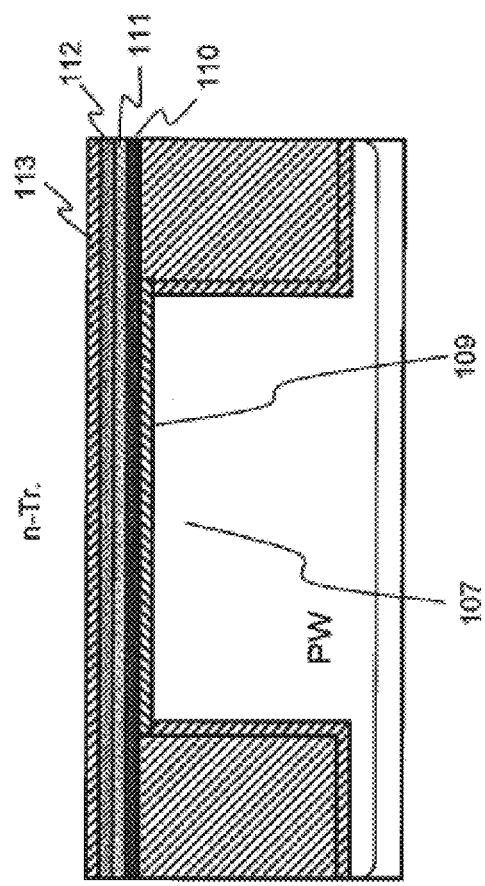
FIG. 5A is a drawing used to describe the step following the step illustrated in FIGS. 4A, 4B and 4C, being a cross-sectional view in a position corresponding to the line A-A' in FIG. 1.
Figure 5B:
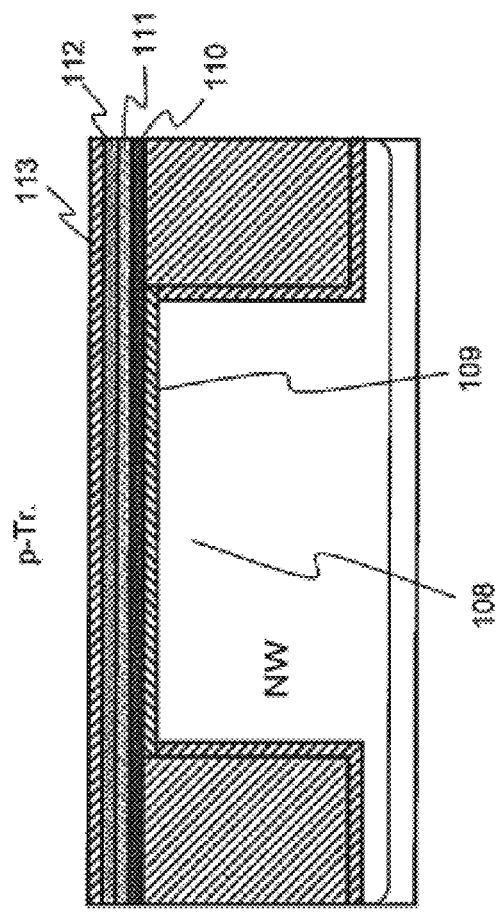
FIG. 5B is a drawing used to describe the step following the step illustrated in FIGS. 4A, 4B and 4C, being a cross-sectional view in a position corresponding to the line B-B' in FIG. 1.

Next, as illustrated in FIGS. 5A, 5B and 5C, a lower-layer gate insulating film (silicon dioxide film) 109 is formed on the active regions 107 and 108 by thermal oxidation. A first high dielectric-constant film (high-k film) 110, a metal gate electrode film (first gate electrode) 111 and a non-doped amorphous silicon (a-Si) gate electrode film 112, and a protective silicon dioxide film 113 are then successively laminated.

The first high dielectric-constant film 110 is an insulating film having a dielectric constant that is higher than that of the silicon dioxide ($SiO_2$) film, and an $HfO_2$ film or an HfSiO film can, for example, be used. These films can be formed by ALD (Atomic Layer Deposition).

The metal gate electrode film 111 comprises a material containing a metal, for example a TiN film or a TaN film. These films can be formed by ALD or PVD (Physical Vapor Deposition).

The non-doped amorphous silicon gate electrode film 112 can be formed by LPCVD (Low Pressure Chemical Vapor Deposition), for example.

The protective silicon dioxide film 113 can be formed by plasma CVD, for example.

Figure 6A:
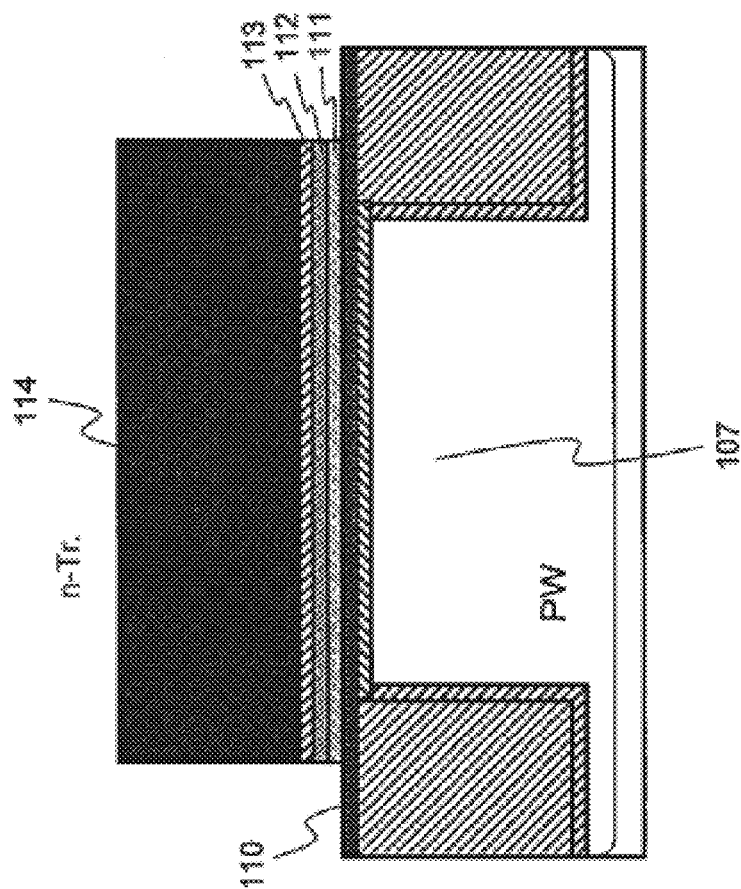
FIG. 6A is a drawing used to describe the step following the step illustrated in FIGS. 5A, 5B and 5C, being a cross-sectional view in a position corresponding to the line A-A' in FIG. 1.
Figure 6B:
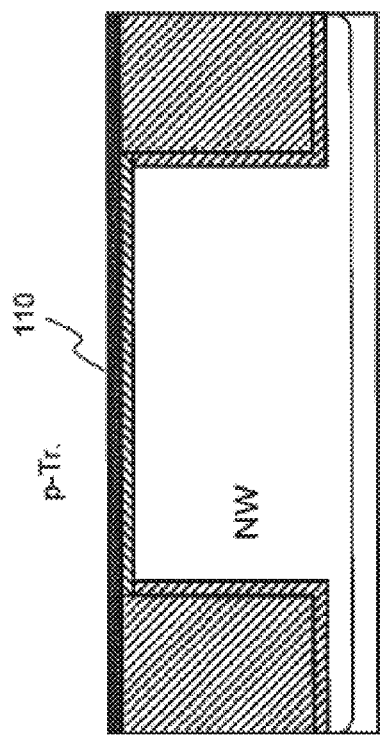
FIG. 6B is a drawing used to describe the step following the step illustrated in FIGS. 5A, 5B and 5C, being a cross-sectional view in a position corresponding to the line B-B' in FIG. 1.

Next, as illustrated in FIGS. 6A, 6B and 6C, a first gate stack lithographic resist mask 114 is formed in such a way as to cover the active region 107 in the n-channel transistor region. The region in which the first gate stack lithographic resist mask 114 is formed is a first gate stack PR resist mask forming region 145. The first gate stack PR resist mask forming regions 145 are larger than the active regions 107, as illustrated in FIG. 1. However, in the first direction (the vertical direction in FIG. 1), the first gate stack lithographic resist mask 114 is formed in such a way that the edges of the first gate stack PR resist mask forming region 145 are as close as possible to the edges of the active regions 107.

The protective silicon dioxide film 113 that is not covered by the first gate stack lithographic resist mask 114 is then removed by dry etching. The exposed non-doped amorphous silicon gate electrode film 112 and the metal gate electrode film 111 are then removed successively by wet etching, using the first gate stack lithographic resist mask 114 and the remaining protective silicon dioxide film 113 as a mask. By this means a first gate stack is formed in the n-channel transistor region.

Here, the first gate stack is formed in such a way that the overlap with the element isolation insulating film 104 in the first direction (the left-right direction in FIG. 6C) is as small as possible. The first direction coincides with the width direction of the channel in the transistor being formed.

Figure 7A:
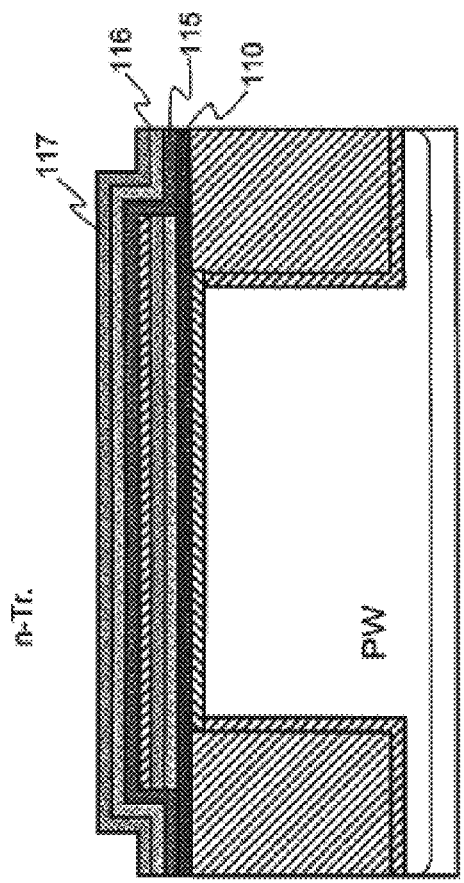
FIG. 7A is a drawing used to describe the step following the step illustrated in FIGS. 6A, 6B and 6C, being a cross-sectional view in a position corresponding to the line A-A' in FIG. 1.
Figure 7B:
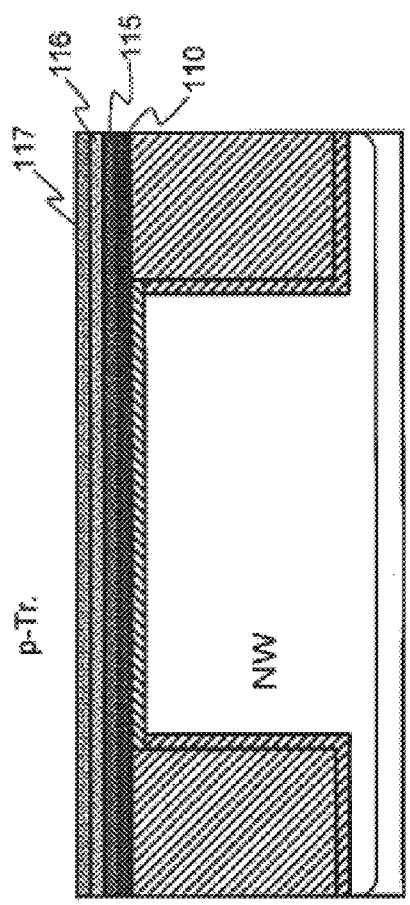
FIG. 7B is a drawing used to describe the step following the step illustrated in FIGS. 6A, 6B and 6C, being a cross-sectional view in a position corresponding to the line B-B' in FIG. 1.

The first gate stack lithographic resist mask 114 is then removed, after which, as illustrated in FIGS. 7A, 7B and 7C, a second high dielectric-constant film 115, a metal gate electrode film (first gate electrode) 116 and an amorphous silicon gate electrode film 117 are successively laminated on the first gate stack and the first high dielectric-constant film 110.

The second high dielectric-constant film 115 is an insulating film having a dielectric constant that is higher than that of the silicon dioxide ($SiO_2$) film, for example an $Al_2O_3$ film. The $Al_2O_3$ film can be formed by ALD.

The metal gate electrode film 116 and the amorphous silicon gate electrode film 117 can respectively be formed using the same material and method as the metal gate electrode film 111 and the non-doped amorphous silicon gate electrode film 112 in the first gate stack.

Figure 8A:
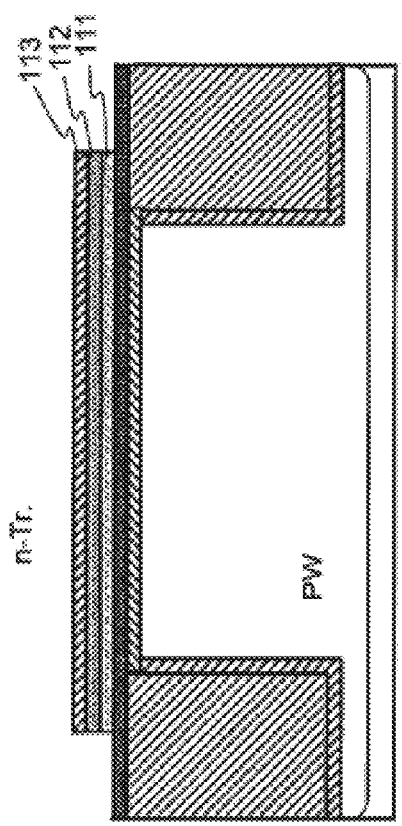
FIG. 8A is a drawing used to describe the step following the step illustrated in FIGS. 7A, 7B and 7C, being a cross-sectional view in a position corresponding to the line A-A' in FIG. 1.
Figure 8B:
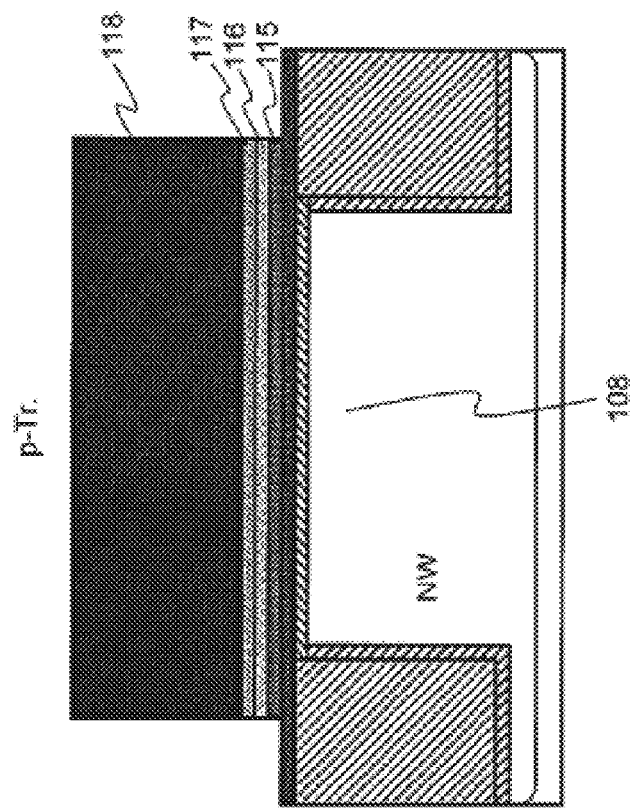
FIG. 8B is a drawing used to describe the step following the step illustrated in FIGS. 7A, 7B and 7C, being a cross-sectional view in a position corresponding to the line B-B' in FIG. 1.

Next, as illustrated in FIGS. 8A, 8B and 8C, a second gate stack lithographic resist mask 118 is formed in such a way as to cover the active region 108 in the p-channel transistor region. The region in which the second gate stack lithographic resist mask 118 is formed is a second gate stack PR resist mask forming region 146. The second gate stack PR resist mask forming regions 146 are larger than the active regions 108, as illustrated in FIG. 1. However, in the first direction (the vertical direction in FIG. 1), the second gate stack lithographic resist mask 118 is formed in such a way that the edges of the second gate stack PR resist mask forming region 146 are as close as possible to the edges of the active regions 108.

The amorphous silicon gate electrode film 117, the metal gate electrode film 116 and the second high dielectric-constant film 115 that are not covered by the second gate stack lithographic resist mask 118 are then successively removed by dry etching. By this means a second gate stack is formed in the p-channel transistor region.

In the same way as with the first gate stack, the second gate stack is also formed in such a way that the overlap with the element isolation insulating film 104 in the first direction (the left-right direction in FIG. 8C) is as small as possible.

Figure 9A:
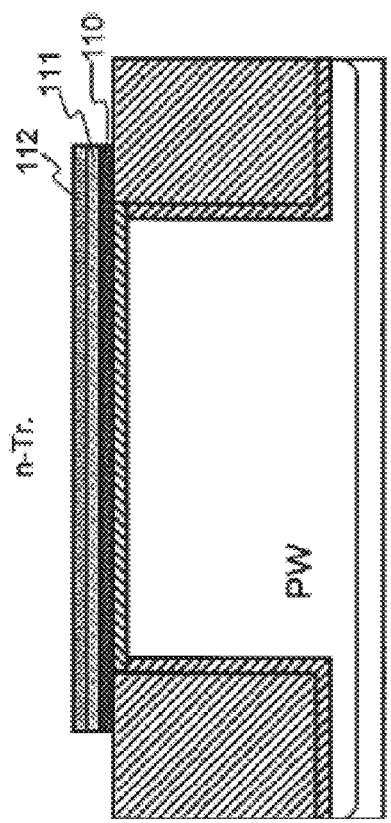
FIG. 9A is a drawing used to describe the step following the step illustrated in FIGS. 8A, 8B and 8C, being a cross-sectional view in a position corresponding to the line A-A' in FIG. 1.
Figure 9B:
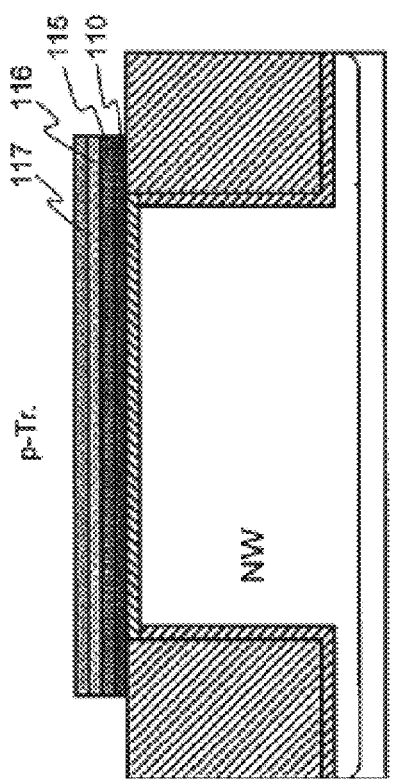
FIG. 9B is a drawing used to describe the step following the step illustrated in FIGS. 8A, 8B and 8C, being a cross-sectional view in a position corresponding to the line B-B' in FIG. 1.
Figure 9C:
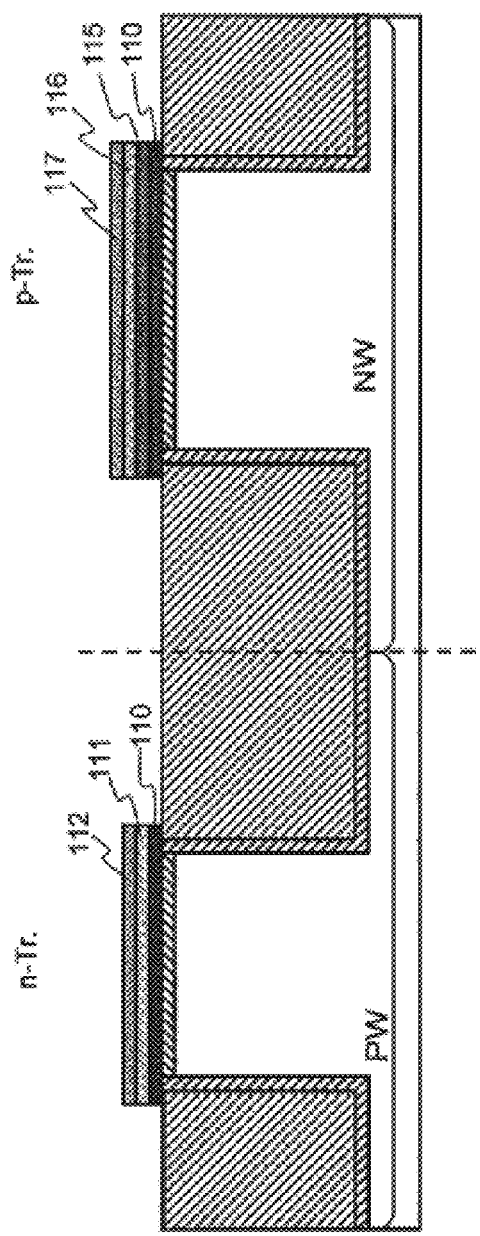
FIG. 9C is a drawing used to describe the step following the step illustrated in FIGS. 8A, 8B and 8C, being a cross-sectional view in a position corresponding to the line C-C' in FIG. 1.

The second gate stack lithographic resist mask 118 is then removed, after which the protective silicon dioxide film 113 remaining on the exposed first high dielectric-constant film 110 and the first gate stack is removed by wet etching, as illustrated in FIGS. 9A, 9B and 9C.

Figure 10A:
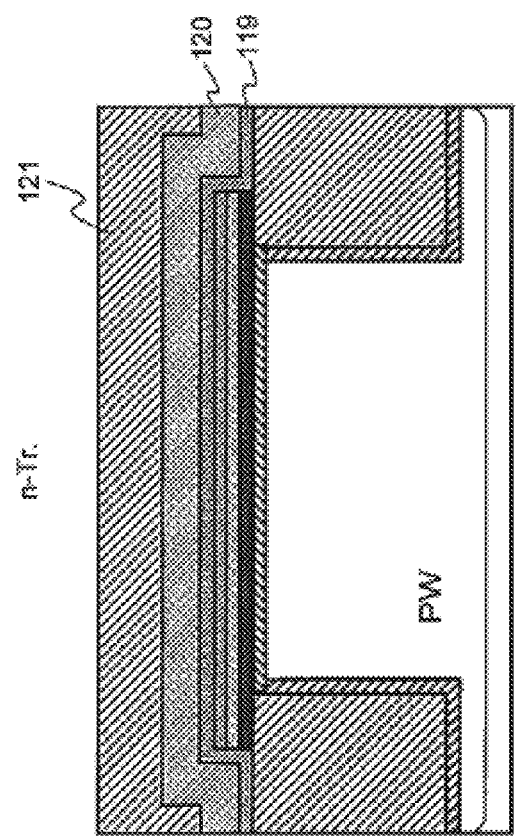
FIG. 10A is a drawing used to describe the step following the step illustrated in FIGS. 9A, 9B and 9C, being a cross-sectional view in a position corresponding to the line A-A' in FIG. 1.
Figure 10B:
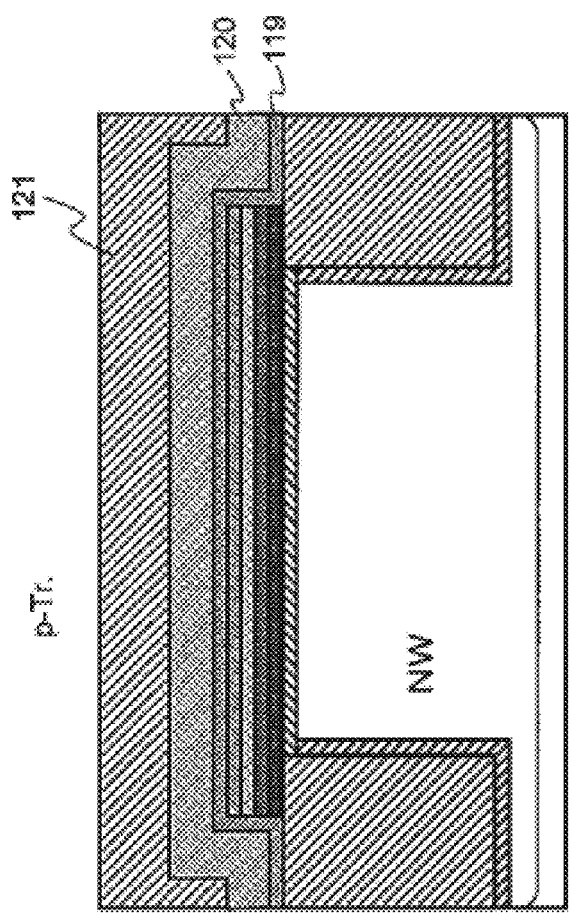
FIG. 10B is a drawing used to describe the step following the step illustrated in FIGS. 9A, 9B and 9C, being a cross-sectional view in a position corresponding to the line B-B' in FIG. 1.

An amorphous silicon gate electrode (second gate electrode) film 119 doped with phosphorus, a metal laminated film 120 and a silicon nitride film 121 are then successively formed, as illustrated in FIGS. 10A, 10B and 10C.

The phosphorus-doped amorphous silicon gate electrode film 119 can be formed by LPCVD. The phosphorus-doped amorphous silicon gate electrode film 119 is used as part of a gate electrode of n-channel transistors and p-channel transistors, and is also used as a gate wiring line connected to thereto.

The metal laminated film 120 is formed by laminating a WSi film serving as an adhesive layer, a WN film serving as a barrier layer, and a W film. The WSi film can be formed by CVD, the WN film can be formed by PVD or ALD, and the W film can be formed by PVD or CVD.

The silicon nitride film 121 can be formed by CVD. The silicon nitride film 121 is used as a hard mask in the next step.

Figure 11A:
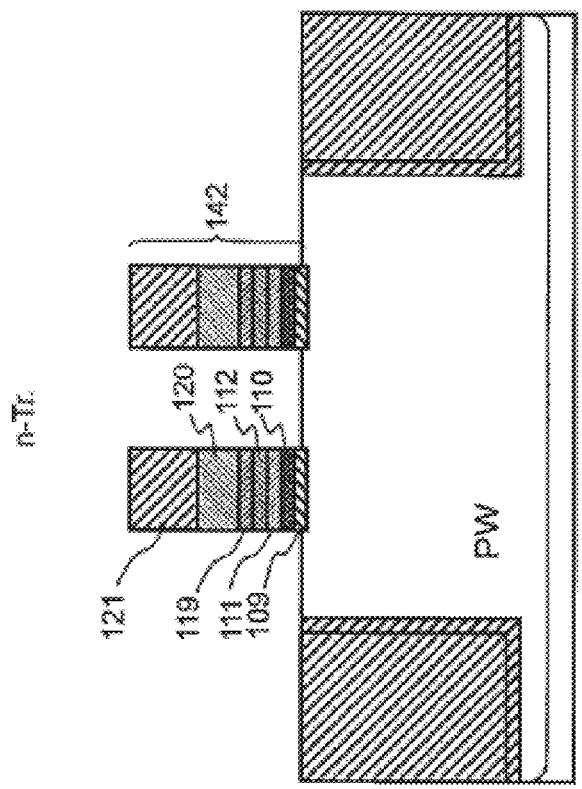
FIG. 11A is a drawing used to describe the step following the step illustrated in FIGS. 10A, 10B and 10C, being a cross-sectional view in a position corresponding to the line A-A' in FIG. 1.
Figure 11B:
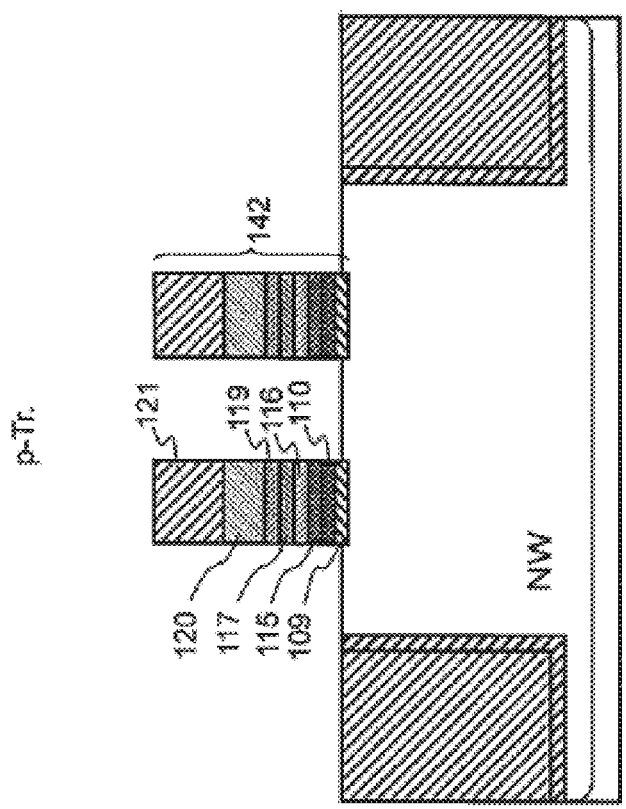
FIG. 11B is a drawing used to describe the step following the step illustrated in FIGS. 10A, 10B and 10C, being a cross-sectional view in a position corresponding to the line B-B' in FIG. 1.
Figure 11C:
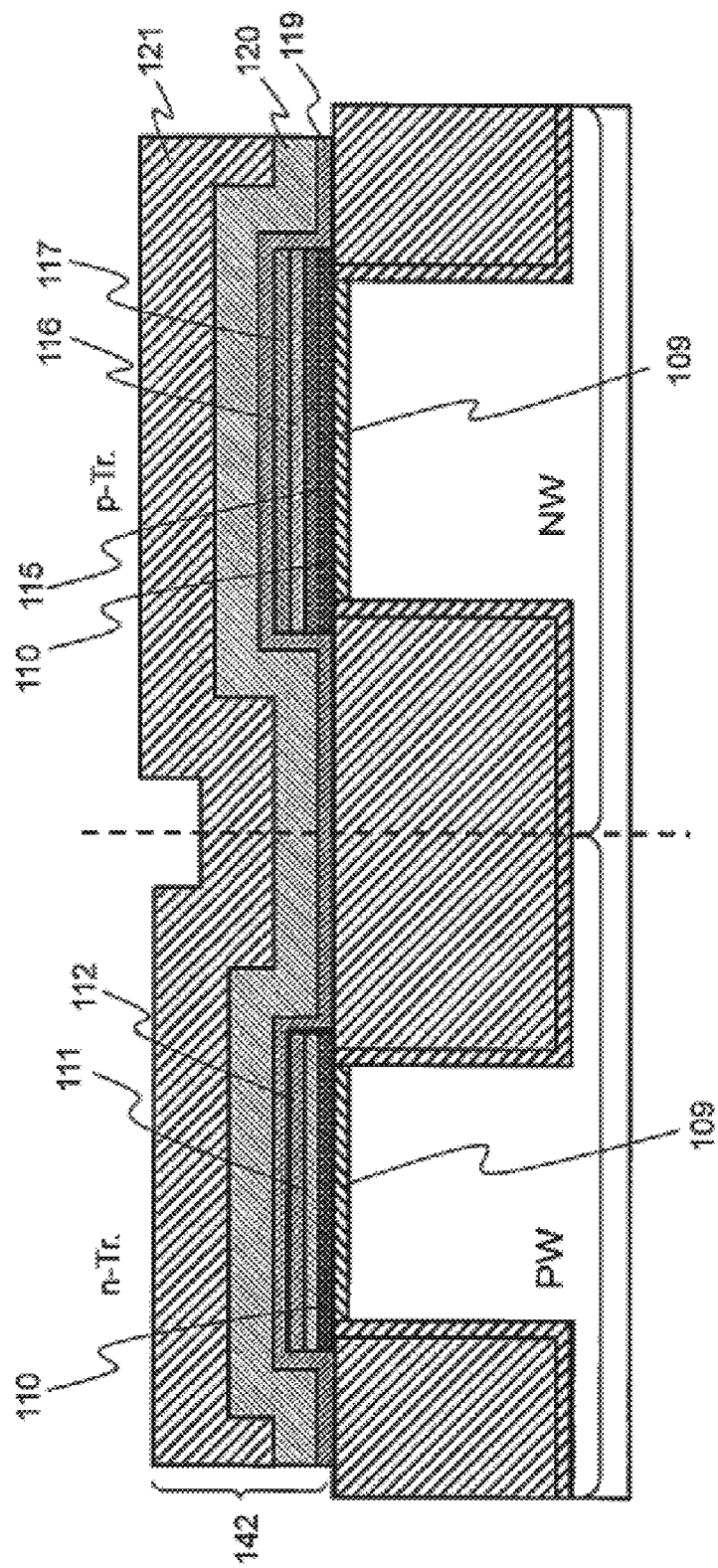
FIG. 11C is a drawing used to describe the step following the step illustrated in FIGS. 10A, 10B and 10C, being a cross-sectional view in a position corresponding to the line C-C' in FIG. 1.

A resist mask having a pattern of gate structures is formed on the silicon nitride film 121, and the resist mask pattern is transferred to the silicon nitride film 121. Then, using a hard mask comprising the resist mask and the silicon nitride film 121, the exposed metal laminated film 120, phosphorus-doped amorphous silicon gate electrode film 119, amorphous silicon gate electrode films 112 and 117, metal gate electrode films 111 and 116 and second high dielectric-constant film 115 are successively removed by dry etching, as illustrated in FIGS. 11A, 11B and 11C. The first high dielectric-constant film 110 and the lower-layer gate insulating film 109 are then removed by wet etching.

By means of the above process, gate structures 142 including the gate insulating films (109, 110 and 115), the gate electrodes (111, 112, 116 and 117) and the gate wiring lines (119 and 120) are formed.

Figure 12A:
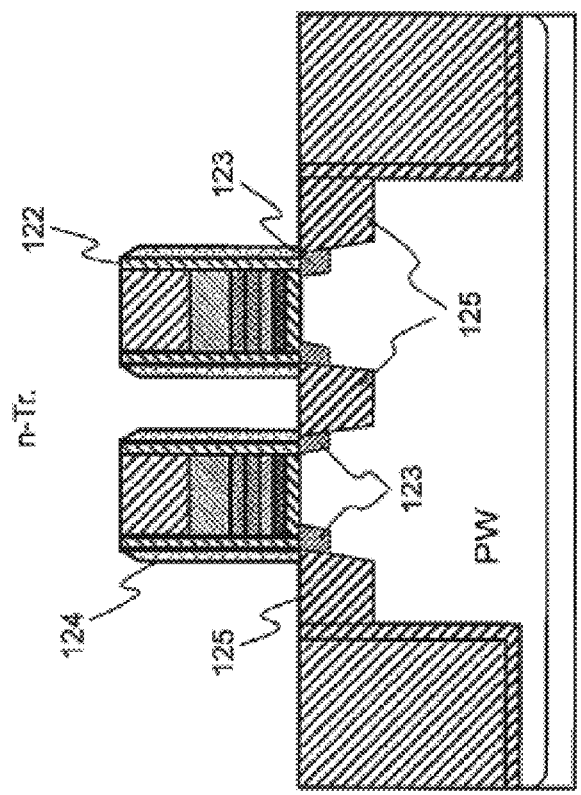
FIG. 12A is a drawing used to describe the step following the step illustrated in FIGS. 11A, 11B and 11C, being a cross-sectional view in a position corresponding to the line A-A' in FIG. 1.
Figure 12B:
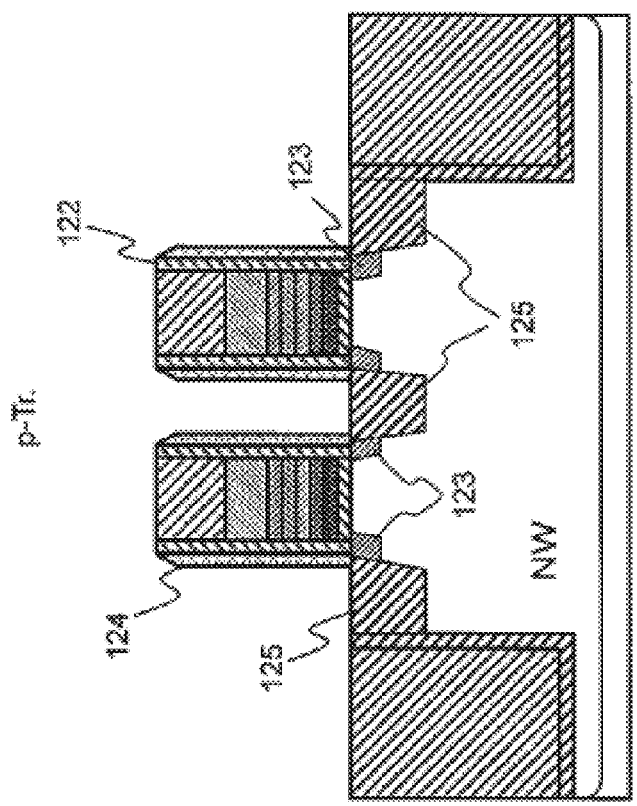
FIG. 12B is a drawing used to describe the step following the step illustrated in FIGS. 11A, 11B and 11C, being a cross-sectional view in a position corresponding to the line B-B' in FIG. 1.
Figure 12C:
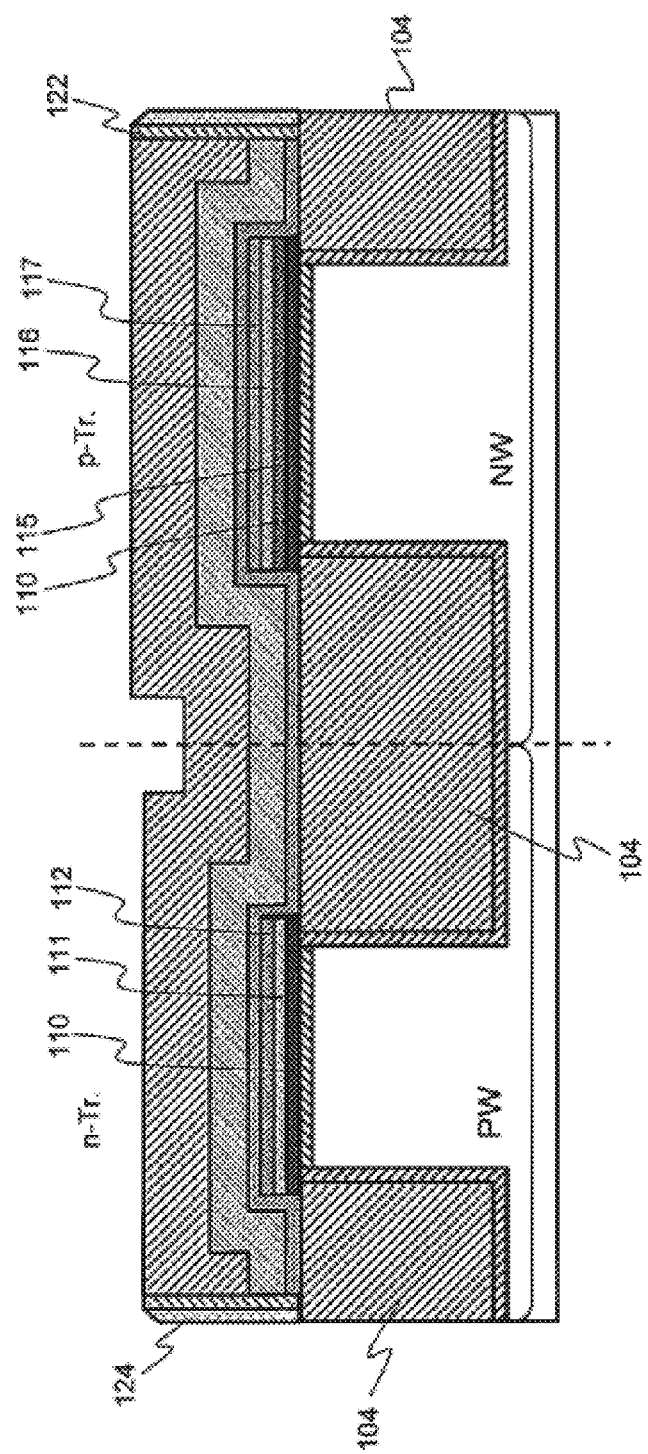
FIG. 12C is a drawing used to describe the step following the step illustrated in FIGS. 11A, 11B and 11C, being a cross-sectional view in a position corresponding to the line C-C' in FIG. 1.

Offset spacers 122 are next formed, as illustrated in FIGS. 12A, 12B and 12C. Silicon nitride films or oxynitride films can be used as the offset spacers 122. The offset spacers 122 can be formed by using ALD, for example, to form a silicon nitride film or the like, and etching this film back.

Forming and halo-injection are then carried out for each of the n-channel and p-channel LDD (Lightly Doped Drain) regions 123.

Side wall spacers 124 are then formed. A silicon dioxide film can be used for the side wall spacers 124. The side wall spacers 124 can be formed by using LPCVD, for example, to form a silicon dioxide film, and etching this film back.

Each of the n-channel and p-channel S/D (Source/Drain) regions 125 is then formed by ion implantation.

Annealing is then performed to activate the impurities. Here, annealing performed at a high temperature for a short period of time, known as spike annealing or millisecond-order annealing, is carried out.

In this mode of embodiment a structure is employed in which the first high dielectric-constant film 110 is substantially not present on the element isolation insulating film 104. Thus even if impurity activation annealing is performed, the amount of oxygen which spreads from the element isolation insulating film 104 to the first high dielectric-constant film 110 is very small. Consequently there is substantially no variation in the thresholds of the transistors. Thus according to this mode of embodiment, even if a plurality of transistors employing various layouts coexist, threshold variability can be suppressed, and the thresholds can be controlled accurately.

A liner silicon nitride film 126 is then formed covering the entire surface, as illustrated in FIGS. 2A, 2B and 2C. An SOD (Spin On Dielectric) film is then formed as an interlayer insulating film 127 on the liner silicon nitride film 126. Further, a cap silicon dioxide film 128 is formed on the interlayer insulating film 127.

Connecting plugs 129 and 130 connected respectively to the metal laminated film 120 and the S/D regions 125, and wiring lines 131 connected to the connecting plugs 129 and 130 are then formed. W can be used as the material for the connecting plugs 129 and 130 and the wiring lines 131.

The semiconductor device is subsequently completed by forming a protective film, for example, using known methods.

A second mode of embodiment of the present invention will now be described.

Figure 13:
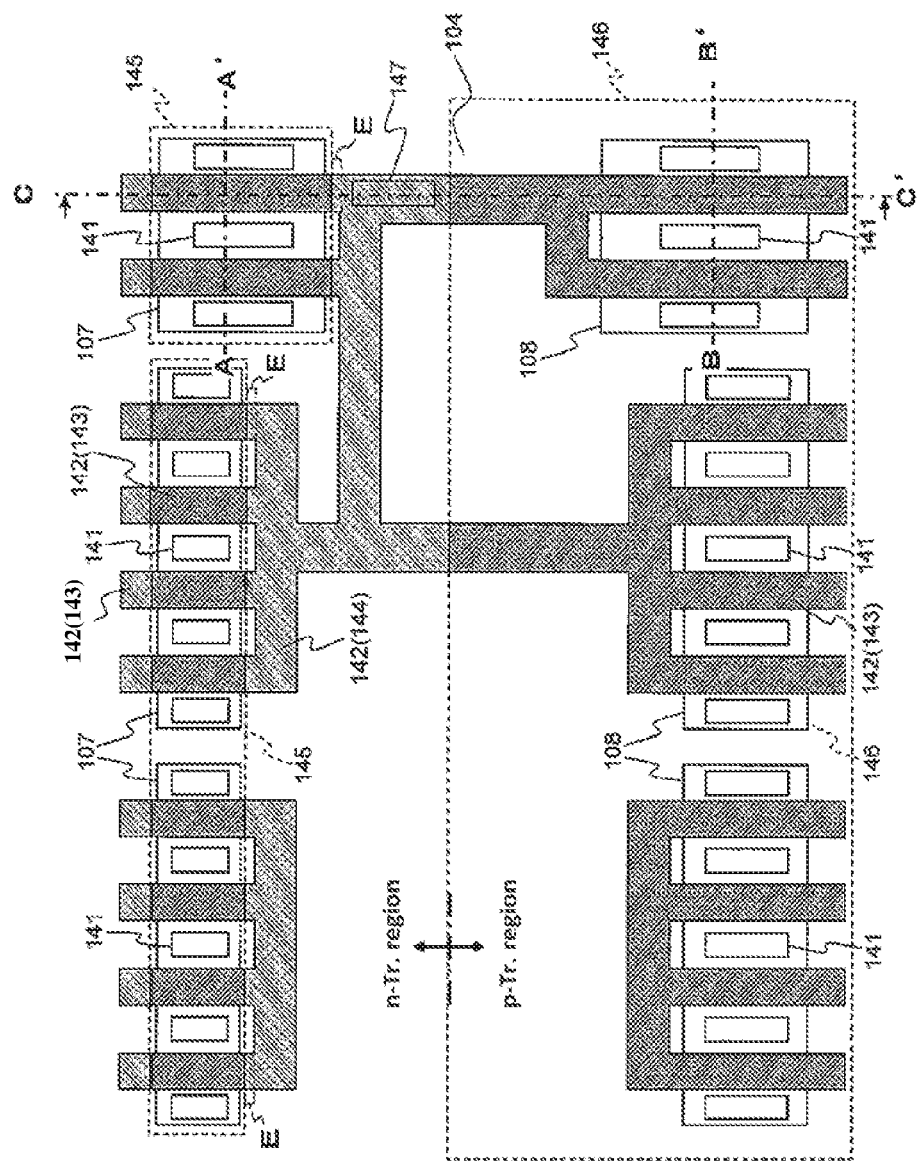
FIG. 13 is a drawing illustrating the planar layout of a semiconductor device according to a second mode of embodiment of the present invention.
Figure 14A:
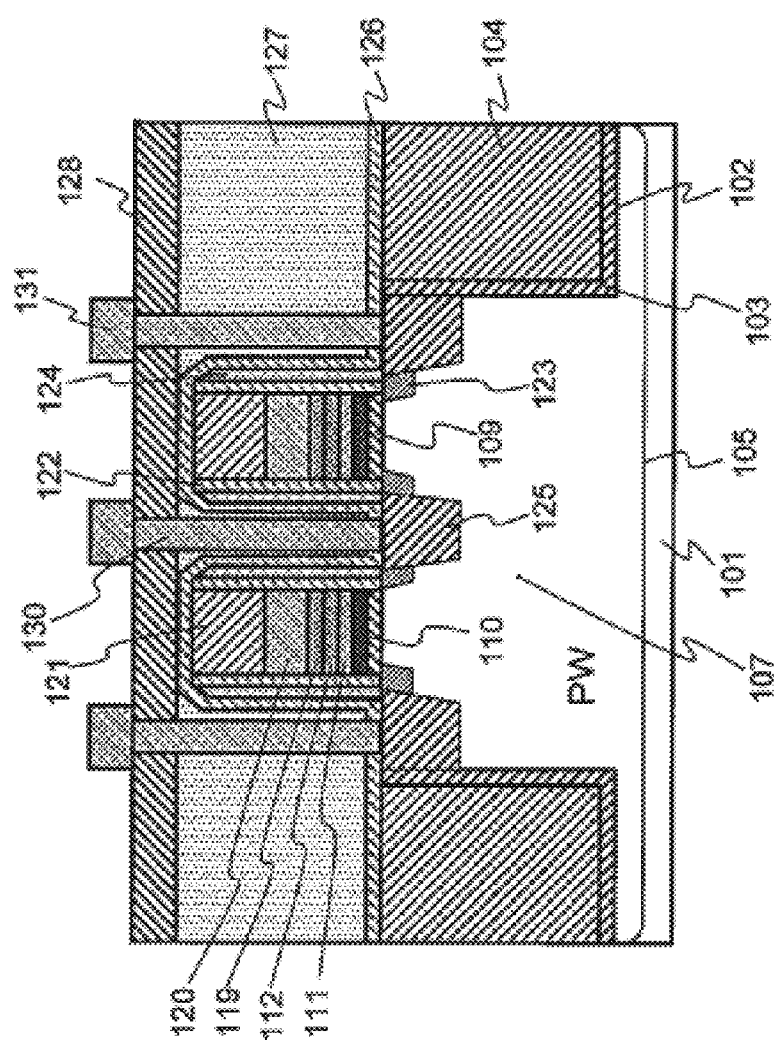
FIG. 14A is a cross-sectional view along the line A-A' in FIG. 13.
Figure 14B:
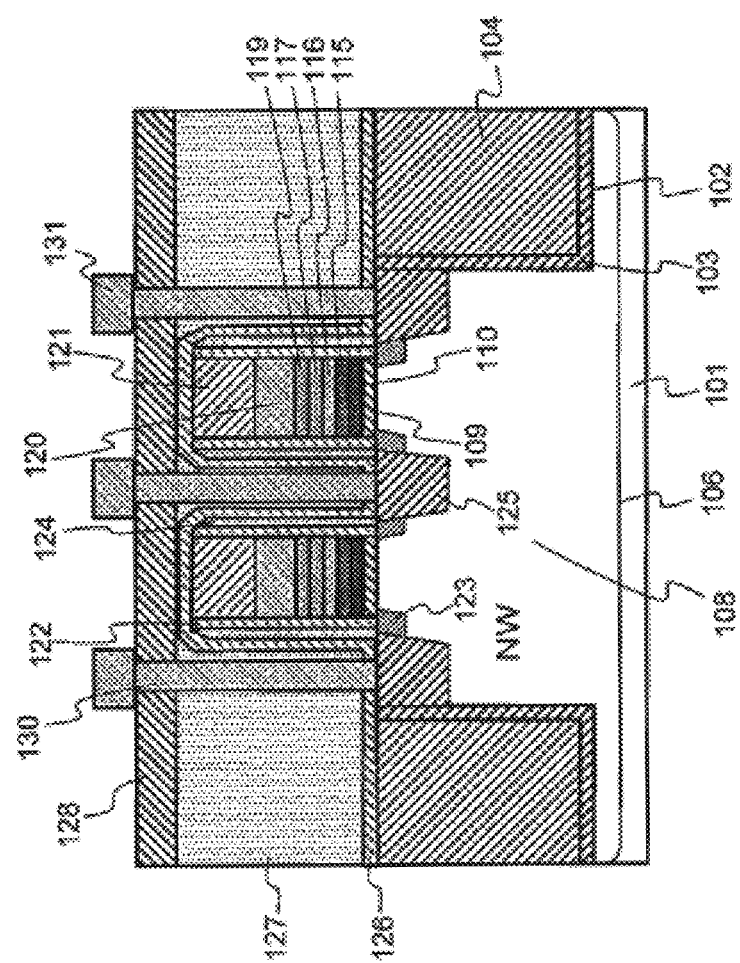
FIG. 14B is a cross-sectional view along the line B-B' in FIG. 13.
Figure 14C:
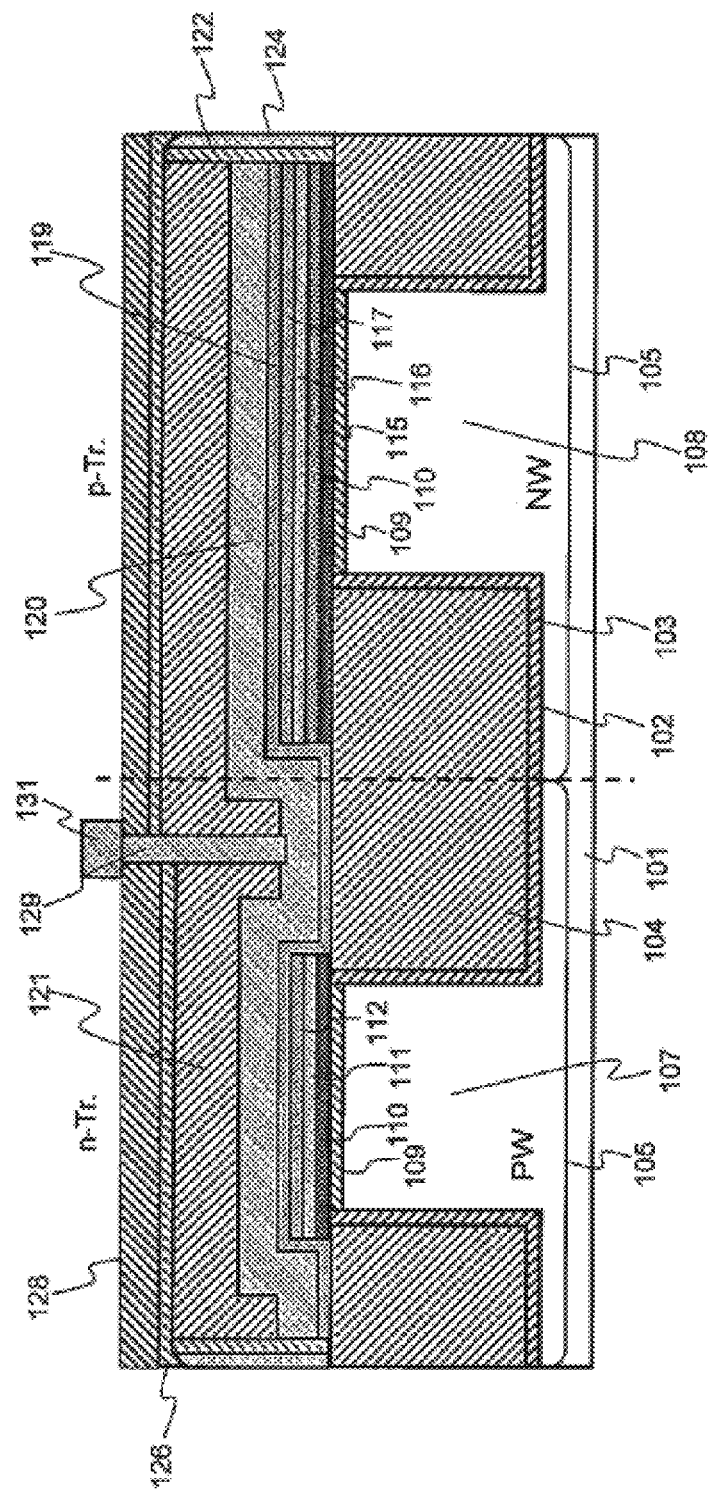
FIG. 14C is a cross-sectional view along the line C-C' in FIG. 13.

FIG. 13 illustrates the planar layout of part of a semiconductor device according to this mode of embodiment of the present invention. Further, FIGS. 14A, 14B and 14C are respectively a cross-sectional view along the line A-N, a cross-sectional view along the line B-B' and a cross-sectional view along the line C-C in FIG. 13. It should be noted that the same reference codes are appended to constituent elements that are the same as in the first mode of embodiment, and descriptions thereof are omitted.

As can be understood by comparing FIG. 13 and FIG. 1, in this mode of embodiment the entire gate structure 142 in the p-channel transistor region comprises the first structural part 143.

Here, in CMOS circuits the channel width of a p-channel transistor is typically made to be two to three times the channel width of an n-channel transistor. Further, the amount of variation in the threshold resulting from the spread of oxygen into the first high dielectric-constant film 110 gradually decreases as the channel width increases. Therefore in a CMOS circuit the impact of variations in the threshold resulting from the spread of oxygen into the first high dielectric-constant film 110 is greater in n-channel transistors than in p-channel transistors.

Accordingly, in this mode of embodiment the second structure is employed in parts of the gate structure 142 in the n-channel transistor region, in which the impact of the spread of oxygen is large.

Substantially the same advantages can be obtained in this mode of embodiment as in the first mode of embodiment. In addition, in this mode of embodiment the second gate stack can be formed using lithography, which has a large minimum processing dimension. As a result, in this mode of embodiment a reduction in the manufacturing cost can be achieved.

A method of manufacturing the semiconductor device according to this mode of embodiment will now be described.

The steps illustrated in the drawings up to FIGS. 7A, 7B and 7C are performed in the same way as in the first mode of embodiment.

Figure 15A:
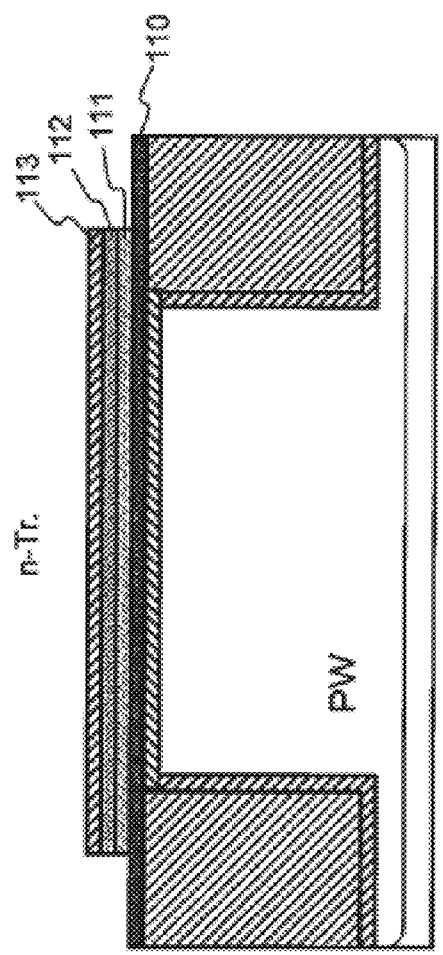
FIG. 15A is a drawing used to describe a method of manufacturing the semiconductor device according to the second mode of embodiment of the present invention, being a cross-sectional view in a position corresponding to the line A-A' in FIG. 13.
Figure 15B:
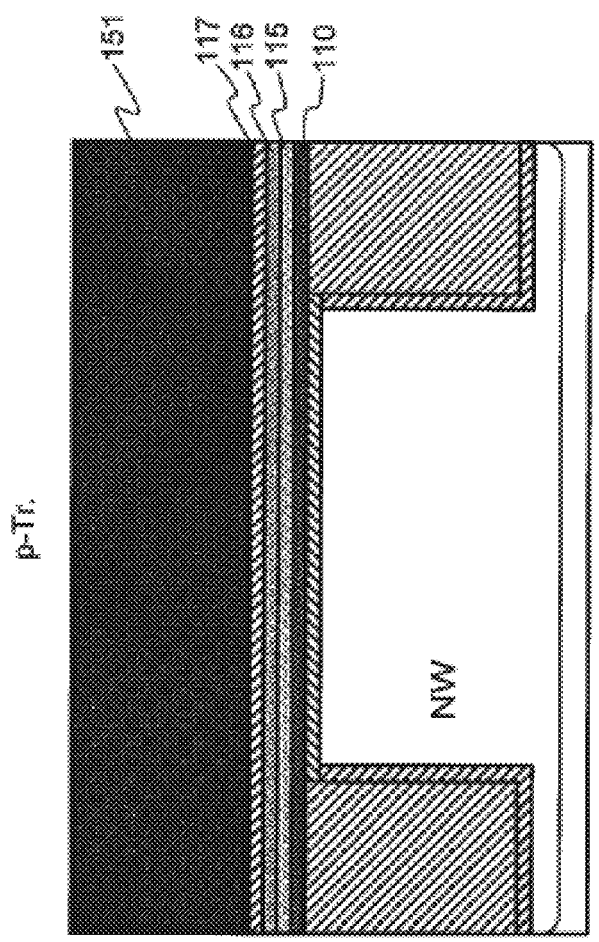
FIG. 15B is a drawing used to describe the method of manufacturing the semiconductor device according to the second mode of embodiment of the present invention, being a cross-sectional view in a position corresponding to the line B-B' in FIG. 13.
Figure 15C:
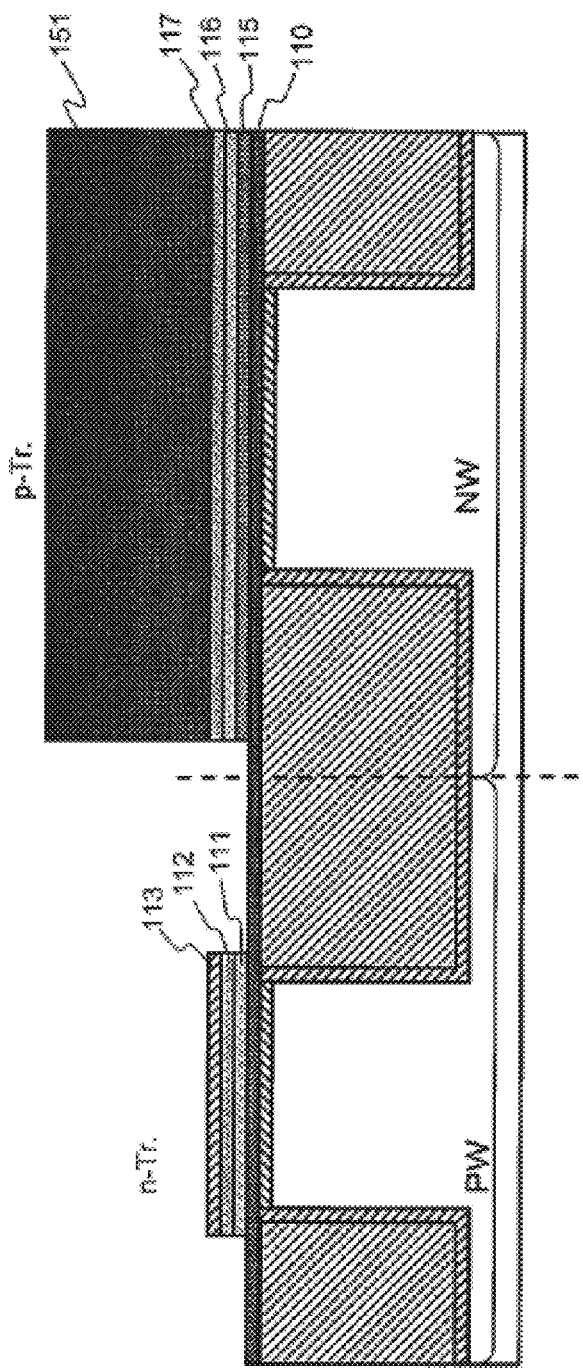
FIG. 15C is a drawing used to describe the method of manufacturing the semiconductor device according to the second mode of embodiment of the present invention, being a cross-sectional view in a position corresponding to the line C-C' in FIG. 13.

Next, as illustrated in FIGS. 15A, 15B and 15C, a second gate stack lithographic resist mask 151 is formed in the p-channel transistor region. The area over which the second gate stack lithographic resist mask 151 is formed is larger than in the first mode of embodiment (146 in FIG. 13).

The amorphous silicon gate electrode film 117, the metal gate electrode film 116 and the second high dielectric-constant film 115 that are not covered by the second gate stack lithographic resist mask 151 are then successively removed by dry etching. By this means a second gate stack is formed in the p-channel transistor region.

The semiconductor device is completed using the same steps as in the first mode of embodiment.

Several modes of embodiment of the present invention have been described hereinabove, but various variations and modifications may be made within the scope of the present invention, without limitation to the abovementioned modes of embodiment of the present invention. For example, various known film materials, film-deposition methods, and etching methods can be employed.

This application is based upon and claims the benefit of priority from Japanese Patent Application No. 2012-257549, filed on Nov. 26, 2012, the entire disclosure of which is incorporated herein by reference.

EXPLANATION OF THE REFERENCE NUMBERS

101 Semiconductor substrate
102 Trench
103 Pad silicon dioxide film
104 Element isolation insulating film
105 p-type well
106 n-type well
107, 108 Active region
109 Lower-layer gate insulating film
110 First high dielectric-constant film
111 Metal gate electrode film
112 Non-doped amorphous silicon gate electrode film
113 Protective silicon dioxide film
114 First gate stack lithographic resist mask
115 Second high dielectric-constant film
116 Metal gate electrode film
117 Amorphous silicon gate electrode film
118 Second gate stack lithographic resist mask
119 Phosphorus-doped amorphous silicon gate electrode film
120 Metal laminated film
121 Silicon nitride film
122 Offset spacer
123 LDD region
124 Side wall spacer
125 S/D region
126 Liner silicon nitride film
127 Interlayer insulating film
128 Cap silicon dioxide film
129, 130 Connecting plug
131 Wiring line
141 Source/drain contact
142 Gate structure
143 First structural part
144 Second structural part
145 First gate stack PR resist mask forming region
146 Second gate stack PR resist mask forming region
147 Gate contact
151 Second gate stack lithographic resist mask

What is claimed is:

1. A device comprising:
a semiconductor substrate comprising, on one surface side thereof, an island-shaped first active region surrounded by an element isolation insulating film formed in an embedded manner;
a gate structure formed on one surface of the semiconductor substrate, wherein the gate structure includes a first part which extends in a first direction in such a way as to cross over the first active region, and a second part which extends in a second direction intersecting the first direction, and which is disposed on the element isolation insulating film in such a way as to connect to the first part, wherein the first direction is parallel to the one surface of the semiconductor substrate and the second direction is parallel to the one surface of the semiconductor substrate;

at least a part of the first part that is located on the first active region employs a first structure in which a high dielectric-constant film, a first electrode film containing a metal, and a second electrode film different from the first electrode film are successively laminated; and the second part employs a second structure which includes the second electrode film but does not include the high dielectric-constant film or the first electrode film.

2. The device of claim 1, wherein the second electrode film of the second part is in contact with the element isolation insulating film.

3. The device of claim 1, wherein the second structure is employed at the boundary between the first part and the second part.

4. The device of claim 1, wherein the gate structure further includes a third part which is disposed parallel to and at a distance from the first part in such a way as to cross over the first active region, and which is connected to the second part, and wherein at least a part of the third part that is located on the first active region employs the first structure.

5. The device of claim 1, wherein:
the semiconductor substrate further comprises an island-shaped second active region surrounded by the element isolation insulating film;
the gate structure further includes a third part which extends in the first direction in such a way as to cross over the second active region, and which is connected to the second part; and
at least a part of the third part that is located on the second active region employs the first structure.

6. The device of claim 1, wherein the first active region is defined in a well formed in the semiconductor substrate, and the first part and the second part are disposed above the well.

7. The device of claim 6, wherein the semiconductor substrate further includes another well of a conductivity type that differs from that of the abovementioned well, and wherein the gate structure includes, above the other well, a part having a disposition and a structure that are similar to those of the first part and the second part.

8. The device of claim 6, wherein the semiconductor substrate further includes another well of a conductivity type that differs from that of the abovementioned well, and wherein the gate structure includes, above the other well, a part which has a disposition that is similar to that of the first part and the second part and which employs the second structure.

9. The device of claim 1, wherein the high dielectric-constant film includes hafnium, the first electrode film includes titanium or tantalum, and the second electrode film includes amorphous silicon.

10. The device of claim 1, comprising a lower-layer gate insulating film formed on the surface of the first active region.

11. A method of manufacturing a device, comprising:
forming a high dielectric-constant film and a first electrode film containing a metal by lamination on one surface side of a semiconductor substrate in such a way as to cover an active region surrounded by an element isolation insulating film;
forming a second electrode film in such a way as to cover the high dielectric-constant film and the first electrode film, and in such a way as to cover the element isolation insulating film; and
wherein the second electrode film, the first electrode film and the high dielectric-constant film are patterned to form a gate structure which includes a plurality of first parts crossing the active region in a first direction, and a second part which extends in a second direction intersecting the first direction and which connects the plurality of first parts to one another, and wherein, in the second part, the second electrode film is in contact with the element isolation insulating film, wherein the first direction is parallel to the one surface side of the semiconductor substrate and the second direction is parallel to the one surface side of the semiconductor substrate.

* * * * *